(12) United States Patent
Jang et al.

(10) Patent No.: US 10,559,720 B2
(45) Date of Patent: Feb. 11, 2020

(54) HIGH-POWER LIGHT-EMITTING DIODE AND LIGHT-EMITTING MODULE HAVING THE SAME

(71) Applicant: Seoul Viosys Co., Ltd., Ansan-si (KR)

(72) Inventors: Jong Min Jang, Ansan-si (KR); Seon Min Bae, Ansan-si (KR); Jae Hee Lim, Ansan-si (KR); Chang Yeon Kim, Ansan-si (KR); Chae Hon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/100,783

(22) Filed: Aug. 10, 2018

(65) Prior Publication Data
US 2018/0351042 A1    Dec. 6, 2018

Related U.S. Application Data

(63) Continuation of application No. PCT/KR2017/000810, filed on Jan. 24, 2017.

(30) Foreign Application Priority Data

Feb. 11, 2016    (KR) .......................... 10-2016-0015753

(51) Int. Cl.
*H01L 33/38* (2010.01)
*H01L 33/32* (2010.01)
(Continued)

(52) U.S. Cl.
CPC ............ *H01L 33/387* (2013.01); *H01L 33/06* (2013.01); *H01L 33/325* (2013.01);
(Continued)

(58) Field of Classification Search
CPC ... H01L 33/0062–0079; H01L 33/0025; H01L 33/002; H01L 33/30–325;
(Continued)

(56) References Cited

U.S. PATENT DOCUMENTS 8,278,669 B2    10/2012    Kim
9,455,300 B1*    9/2016    Collins ................. H01L 27/156
(Continued)

FOREIGN PATENT DOCUMENTS

JP    2015-167245    9/2015
KR    10-2010-0054197    5/2010
(Continued)

OTHER PUBLICATIONS

International Search Report dated May 15, 2017, in International Application No. PCT/KR2017/000810 (with English Translation).

*Primary Examiner* — Scott B Geyer
(74) *Attorney, Agent, or Firm* — H.C. Park & Associates, PLC

(57) ABSTRACT

An LED includes a gallium nitride substrate, a first semiconductor layer disposed thereon, and a mesa including a second semiconductor layer disposed on the first semiconductor layer and an intervening active layer. A first contact layer includes an outer contact part in contact with the first semiconductor layer near an edge of the substrate and an inner contact part in contact with the first semiconductor layer within a region encompassed by the outer contact part. A second contact layer is disposed on the mesa in contact with the second semiconductor layer. An upper insulation layer has first and second opening parts overlapping the first and second contact layers. First and second electrode pads are electrically connected to the first and second contact layers through the first and second opening parts. The LED can be driven at 150-315 A/cm$^2$ and has a maximum junction temperature of 150-190° C.

20 Claims, 22 Drawing Sheets

(51) Int. Cl.
    *H01L 33/64*     (2010.01)
    *H01L 33/40*     (2010.01)
    *H01L 33/62*     (2010.01)
    *H01L 33/06*     (2010.01)
    *H01L 33/20*     (2010.01)

(52) U.S. Cl.
    CPC ............ *H01L 33/385* (2013.01); *H01L 33/40* (2013.01); *H01L 33/62* (2013.01); *H01L 33/64* (2013.01); *H01L 33/20* (2013.01)

(58) Field of Classification Search
    CPC ............... H01L 33/36–42; H01L 33/62; H01L 2933/0016; H01L 2933/0066; H01L 33/44; H01L 33/52–56; H01L 2933/005; H01L 33/54
    See application file for complete search history.

(56) References Cited

U.S. PATENT DOCUMENTS

| | | | |
|---|---|---|---|
| 2007/0145396 A1* | 6/2007 | Watanabe | H01L 33/405 257/98 |
| 2010/0109022 A1 | 5/2010 | Kim | |
| 2011/0279054 A1 | 11/2011 | Katona et al. | |
| 2014/0021883 A1 | 1/2014 | Katona et al. | |
| 2015/0084085 A1* | 3/2015 | Chae | H01L 33/08 257/98 |
| 2015/0108525 A1* | 4/2015 | Chae | H01L 33/38 257/98 |
| 2015/0295138 A1* | 10/2015 | Chae | H01L 33/405 257/98 |
| 2015/0380620 A1* | 12/2015 | Chae | H01L 33/38 257/98 |
| 2015/0380621 A1* | 12/2015 | Chae | H01L 33/62 257/93 |
| 2016/0013388 A1* | 1/2016 | Lee | H01L 27/156 257/13 |
| 2016/0351755 A1* | 12/2016 | Lee | H01L 33/56 |
| 2017/0062680 A1* | 3/2017 | Yoo | H01L 33/60 |
| 2017/0365739 A1* | 12/2017 | Park | H01L 33/22 |
| 2018/0122991 A1* | 5/2018 | Lee | H01L 33/36 |
| 2018/0190877 A1* | 7/2018 | Hirano | H01L 33/44 |
| 2018/0277719 A1* | 9/2018 | Lee | H01L 33/06 |

FOREIGN PATENT DOCUMENTS

| | | |
|---|---|---|
| KR | 10-2012-0085775 | 8/2012 |
| KR | 10-2013-0094621 | 8/2013 |
| KR | 10-2016-0009098 | 1/2016 |

\* cited by examiner

HIGH-POWER LIGHT-EMITTING DIODE AND LIGHT-EMITTING MODULE HAVING THE SAME

CROSS-REFERENCE TO RELATED APPLICATIONS

This application is a Continuation of International Patent Application No. PCT/K2017/000810, filed on Jan. 24, 2017, and claims priority from and the benefit of Korean Patent Application No. 10-2016-0015753, filed on Feb. 11, 2016, all of which are hereby incorporated by reference for all purposes as if fully set forth herein.

BACKGROUND

Field

Exemplary embodiments of the present disclosure relate to a light emitting diode and a light emitting module, and, more particularly, to a high-power light emitting diode capable of operating at a high current density and a light emitting module including the same.

Discussion of the Background

In general, with good thermal stability and a direct transition type energy band structure, Group III-based nitrides, such as gallium nitride (GaN), aluminum nitride (AlN), and the like, have been spotlighted as materials for light sources in the visible range and the ultraviolet range. In particular, blue and green light emitting diodes using indium gallium nitride (InGaN) are used in various fields including large natural color flat displays, signal lamps, interior lighting, high density light sources, high resolution output systems, optical communication, and the like.

Typically, a heterogeneous substrate having a similar crystal structure to a nitride semiconductor layer has been used as a growth substrate for growth of the nitride semiconductor layer due to difficulty in fabrication of a homogeneous substrate capable of growing such Group III-based nitride semiconductor layers. In particular, a sapphire substrate having a hexagonal crystal structure is generally used as the heterogeneous substrate. In recent years, a technique has been developed for manufacturing a high efficiency vertical type light emitting diode, in which epitaxial layers such as nitride semiconductor layers are grown on a heterogeneous substrate, such as a sapphire substrate, and a support substrate is bonded to the epitaxial layers, followed by separating the heterogeneous substrate through laser lift-off or the like.

However, the epitaxial layer grown on the heterogeneous substrate has a relatively high current density due to lattice mismatch and difference in coefficient of thermal expansion between the epitaxial layer and the growth substrate. In general, an epitaxial layer grown on a sapphire substrate is known to have a current density of $1E8/cm^2$ or more. With such an epitaxial layer having high current density, a light emitting diode has a limit in improvement in luminous efficacy.

Moreover, in order to reduce manufacturing costs of a light emitting diode, there is a need to increase the quantity of light emitted from the light emitting diode per unit area. To this end, the light emitting diode is required to operate at high current density. However, in operation at high current density, the light emitting diode suffers from a severe drooping phenomenon due to current crowding through dislocations than in operation at low current density, thereby causing severe deterioration in internal quantum efficiency. In addition, since the epitaxial layer grown on the heterogeneous substrate has a very thin thickness of several micrometers, as compared with a light emitting area of, for example, $350\ \mu m \times 350\ \mu m$ or $1\ mm^2$, the light emitting diode undergoes difficulty in current spreading in the horizontal direction and thus suffers from further deterioration in luminous efficacy with increasing current density.

Moreover, in operation at high current density, the light emitting diode generates a significant quantity of heat, causing increase in junction temperature thereof. Typically, the light emitting diode has a maximum junction temperature (Max Tj) of 150° C. or less. However, in order to use such a light emitting diode at a high current density of 150 $A/cm^2$ or more, there is a need for a particular cooling system for preventing increase in junction temperature.

SUMMARY

Exemplary embodiments of the present disclosure provide a high-power light emitting diode that emits light in an increased quantity per unit area.

Exemplary embodiments of the present disclosure provide a high-power light emitting diode that can achieve uniform current spreading over a broad area thereof through improvement in current spreading performance in a horizontal direction.

Exemplary embodiments of the present disclosure provide a high-power light emitting diode that can be used at high current density without a separate cooling system.

In accordance with exemplary embodiments of the present disclosure, there is provided a light emitting diode including: a gallium nitride substrate; a first conductivity-type semiconductor layer disposed on the gallium nitride substrate; a mesa including a second conductivity-type semiconductor layer disposed on the first conductivity-type semiconductor layer and an active layer interposed between the second conductivity-type semiconductor layer and the first conductivity-type semiconductor layer; a first contact layer including an outer contact portion disposed along a circumference of the mesa and contacting the first conductivity-type semiconductor layer near an edge of the gallium nitride substrate and a plurality of inner contact portions disposed in a region surrounded by the outer contact portion and contacting the first conductivity-type semiconductor layer; a second contact layer disposed on the mesa and contacting the second conductivity-type semiconductor layer; an upper insulation layer having a first opening overlapping the first contact layer and a second opening overlapping the second contact layer; a first electrode pad electrically connected to the first contact layer through the first opening; and a second electrode pad electrically connected to the second contact layer through the second opening, wherein the light emitting diode is capable of operating at a current density of 150 $A/cm^2$ or more and has a maximum junction temperature of 180° C. or more.

In accordance with other exemplary embodiments of the present disclosure, there is provided a light emitting module including: a printed circuit board; a submount mounted on the printed circuit board; and the light emitting diode flip-bonded to the submount.

DETAILED DESCRIPTION OF THE ILLUSTRATED EMBODIMENTS

Figure 1A:
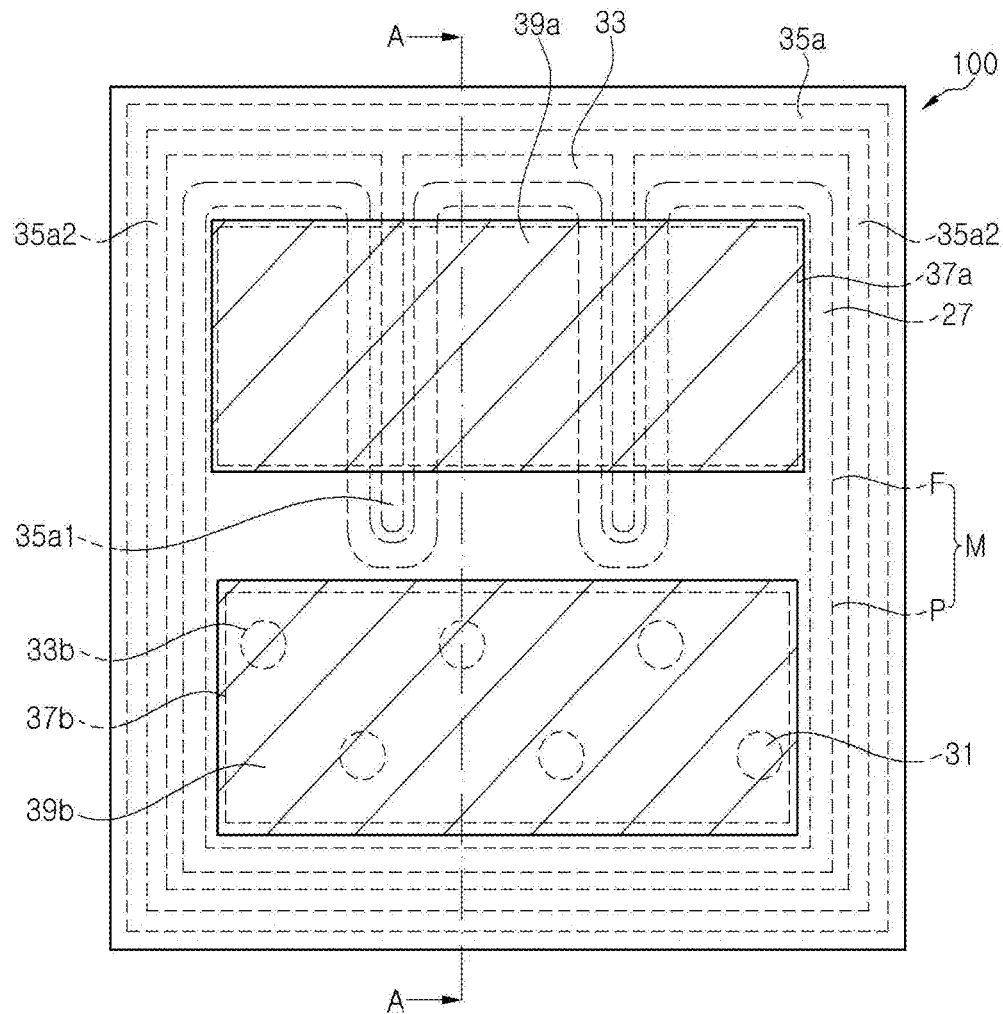
FIGS. 1A and 1B show a schematic plan view and a schematic cross-sectional view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present invention pertains. Accordingly, the present invention is not limited to the exemplary embodiments disclosed herein and can also be implemented in different forms. In the drawings, widths, lengths, thicknesses, and the like of elements can be exaggerated for clarity and descriptive purposes. Throughout the specification, like components will be denoted by like reference numerals.

A light emitting diode according to one exemplary embodiment of the present disclosure includes: a gallium nitride substrate; a first conductivity-type semiconductor layer disposed on the gallium nitride substrate; a mesa including a second conductivity-type semiconductor layer disposed on the first conductivity-type semiconductor layer and an active layer interposed between the second conductivity-type semiconductor layer and the first conductivity-type semiconductor layer; a first contact layer contacting the first conductivity-type semiconductor layer and including an outer contact portion disposed along a circumference of the mesa and contacting the first conductivity-type semiconductor layer near an edge of the gallium nitride substrate and a plurality of inner contact portions disposed in a region surrounded by the outer contact portion; a second contact layer disposed on the mesa and contacting the second conductivity-type semiconductor layer; an upper insulation layer having a first opening overlapping the first contact layer and a second opening overlapping the second contact layer; a first electrode pad electrically connected to the first contact layer through the first opening; and a second electrode pad electrically connected to the second contact layer through the second opening, wherein the light emitting diode is capable of operating at a current density of 150 A/cm$^2$ or more and has a maximum junction temperature of 180° C. or more.

Conventionally, a light emitting diode including gallium nitride semiconductor layers grown on a heterogeneous substrate, such as a sapphire substrate, exhibits deterioration in external efficiency by 20% or more at a current density of 150 A/cm$^2$ or more due to efficiency droop and has a maximum junction temperature of less than 150° C., thereby causing difficulty in operation for a long period of time at 150 A/cm$^2$ or more. On the contrary, according to the exemplary embodiment, the light emitting diode employs the gallium nitride substrate, the first contact layer includes the outer contact portion and the inner contact portions to assist in current spreading in the first conductivity-type semiconductor layer, and the second contact layer is disposed on the mesa to assist in current spreading in the second conductivity-type semiconductor layer. With this structure, the light emitting diode has a maximum junction temperature of 180° C. or more and can operate at a current density of 150 A/cm$^2$ or more for a long period of time.

In some exemplary embodiments, the plurality of inner contact portions may extend from the outer contact portion. Alternatively, the inner contact portions may be separated from the outer contact portion.

The first contact layer may be spaced apart from the mesa while covering an upper region of the mesa, and may have an opening overlapping the second contact layer, and a sidewall of the opening of the first contact layer may be covered by the upper insulation layer. Since the first contact layer covers the upper region of the mesa, the first contact layer can be disposed in a broad area. With this structure, the light emitting diode allows rapid supply of electric current to the outer contact portion and the inner contact portions, thereby improving current spreading performance and heat dissipation characteristics.

The light emitting diode may further include an intermediate connecting portion disposed inside the opening of the first contact layer and connected to the second contact layer. The second opening of the upper insulation layer may expose the intermediate connecting portion and the second electrode pad may be connected to the intermediate connecting portion. With the intermediate connecting portion, the light emitting diode has the first electrode pad and the second electrode pad placed at the same level, thereby further stabilizing a process of manufacturing the light emitting diode. The intermediate connecting portion may be formed of the same material by the same process as the first contact layer.

The light emitting diode may further include a lower insulation layer covering the first conductivity-type semiconductor layer and the mesa to insulate the first contact layer from the mesa and interposed between the second contact layer and the intermediate connecting portion. The lower insulation layer may have an opening exposing the first conductivity-type semiconductor layer such that the outer contact portion and the inner contact portion contact the first conductivity-type layer through the opening exposing the first conductivity-type semiconductor layer. The lower insulation layer may also have an opening exposing the second contact layer. The intermediate connecting portion may be connected to the second contact layer through the opening of the lower insulation layer exposing the second contact layer.

The gallium nitride substrate may include a side surface. The side surface of the gallium nitride substrate may include a perpendicular surface perpendicular to an upper surface of the gallium nitride substrate on which the first conductivity-type semiconductor layer is placed and a first inclined surface connecting the perpendicular surface to a lower surface of the gallium nitride substrate. Here, the gallium nitride substrate may have a thickness of 300 μm or more and the perpendicular surface may have a height of 50 μm to 200 μm. The perpendicular surface may be formed by cracking the gallium nitride substrate. The gallium nitride substrate may have a rectangular shape or square shape. Such a gallium nitride substrate is formed by dicing a wafer having a plurality of light emitting diodes formed on a relatively large growth substrate into individual light emitting diodes. Upon dicing of a relatively thick gallium nitride substrate having a thickness of 300 μm or more, the wafer can suffer from cracking in an undesired direction due to the crystal structure of the gallium nitride substrate, instead of being divided into a rectangular or a square shape. In order to prevent this problem, the gallium nitride substrate is subjected to scribing with a laser beam to a thickness of 50 μm to 200 μm, followed by cracking, thereby providing a substrate having a desired rectangular or square shape.

The side surface of the gallium nitride substrate may further include a second inclined surface connecting the perpendicular surface to the upper surface of the gallium nitride substrate. With the second inclined surface, the light emitting diode can have an increased surface area to increase a contact area with an external environment, thereby improving heat dissipation performance. In addition, the gallium nitride substrate may have a depth of 30 μm to 50 μm from the upper surface of the gallium nitride substrate to the perpendicular surface and a depth of 80 μm to 100 μm from the lower surface of the gallium nitride substrate to the perpendicular surface.

If the distance from the upper surface of the gallium nitride substrate to the perpendicular surface is greater than the distance from the lower surface of the gallium nitride substrate to the perpendicular surface, the area of the active layer for generation of light can be decreased. Accordingly, the light emitting diode has a relatively small distance from the upper surface of the gallium nitride substrate to the perpendicular surface to secure the area of the active layer.

The upper insulation layer may cover the second inclined surface above the perpendicular surface along an edge of the substrate. Accordingly, the upper insulation layer covers a side surface of the first conductivity-type semiconductor layer and can protect the first conductivity-type semiconductor layer from external environments such as moisture.

In some exemplary embodiments, the gallium nitride substrate may include a surface texture on the lower surface of the gallium nitride substrate. The surface texture may include a plurality of truncated cones. The surface texture can improve light extraction efficiency of the light emitting diode. The light emitting diode may further include a mask disposed on each of the truncated cones. The masks may be formed of, for example, $SiO_2$. With the structure wherein $SiO_2$ having a lower index of refraction than the gallium nitride substrate is disposed on each of the truncated cones, the light emitting diode can have further improved light extraction efficiency through reduction in total internal reflection.

The mask may have an upwardly convex shape, thereby further improving light extraction efficiency.

In the light emitting diode according to the exemplary embodiment, a sharp valley is formed between the truncated cones. If the valley formed between the truncated cones has a flat bottom, total internal reflection occurs on the bottom of the valley, thereby deteriorating light extraction efficiency. In particular, since the gallium nitride substrate has a high index of refraction of about 2.43, total internal reflection is likely to occur on the flat bottom of the valley. However, since the sharp valley does not have a flat bottom, it is possible to prevent light loss due to total internal reflection.

The gallium nitride substrate may have a dopant concentration of $8E17/cm^3$ to $1E18/cm^3$ and the first conductivity-type semiconductor layer may have a dopant concentration of $1E19/cm^3$ to $2E19/cm^3$. With the structure wherein the dopant concentration of the first conductivity-type semiconductor layer is higher than that of the gallium nitride substrate, the light emitting diode can reduce contact resistance of the first contact layer. In addition, the gallium nitride substrate is doped with dopants, thereby enabling current spreading through the gallium nitride substrate.

A light emitting module according to another exemplary embodiment of the present disclosure includes: a printed circuit board; a submount mounted on the printed circuit board; and the aforementioned light emitting diode is flip-bonded to the submount. Accordingly, it is possible to provide a light emitting module in which the light emitting diode outputs an increased quantity of light per unit area.

The submount may include a base substrate; an upper electrode pattern disposed on the base substrate and including a first upper electrode and a second upper electrode; a lower electrode pattern disposed on a bottom of the base substrate and including a first lower electrode and a second lower electrode; and vias connecting the upper electrode pattern to the lower electrode pattern.

The base substrate may be an aluminum nitride substrate, and each of the upper electrode pattern and the lower electrode pattern may be composed of an Ni layer/Cu layer/Au layer.

The lower electrode pattern may further include a heat dissipation pad. The heat dissipation pad contacts the printed circuit board to assist in heat dissipation.

Hereinafter, exemplary embodiments of the present disclosure will be described in more detail with reference to the accompanying drawings.

Figure 1B:
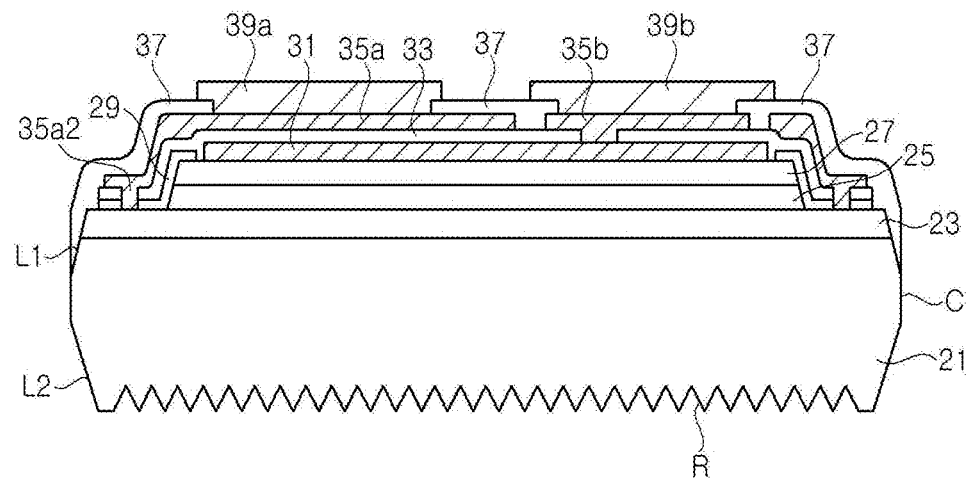

FIGS. 1A and 1B show a schematic plan view and a schematic cross-sectional view of a light emitting diode according to one exemplary embodiment of the present disclosure. The cross-sectional view of FIG. 1B is taken along line A-A of the plan view of FIG. 1A.

Referring to FIGS. 1A and 1B, the light emitting diode includes a substrate 21, a first conductivity-type semiconductor layer 23, an active layer 25, a second conductivity-type semiconductor layer 27, a first contact layer 35a, a second contact layer 31, a lower insulation layer 33, an upper insulation layer 37, a first electrode pad 39a, and a second electrode pad 39b.

The substrate 21 may be a polar or non-polar gallium nitride substrate. For example, the substrate 21 may be a polar gallium nitride substrate having a c-plane as a growth plane, a non-polar gallium nitride substrate having an m-plane or an a-plane as a non-polar growth plane, or a semi-polar gallium nitride substrate. Herein, the "gallium nitride substrate" means a substrate comprising a compound of nitrogen and gallium and may further comprise other Group III elements, for example, Al or In. In addition, the gallium nitride substrate may be doped with dopants, such as Si, and may have a dopant concentration of $8E17/cm^3$ or more, specifically in the range of $8E17/cm^3$ to $1E18/cm^3$.

The substrate 21 may have a thickness of, for example, about 300 μm or more. Since the gallium nitride substrate 21 has a relatively large thickness, the gallium nitride substrate facilitates current spreading of the light emitting diode and can receive heat generated from the light emitting diode, thereby improving thermal characteristics of the light emitting diode.

As shown in the plan view of FIG. 1A, the substrate 21 may have a rectangular or square shape and includes a side surface. The substrate 21 may have a square shape having a size of, for example, 1,000 μm×1,000 μm or 700 μm×700 μm, or a rectangular shape having a similar size thereto. On the other hand, as shown in FIG. 1B, the side surface of the substrate 21 includes a perpendicular surface C perpendicular to an upper surface of the substrate 21 and an inclined surface L2 connecting the perpendicular surface C to a lower surface of the substrate 21. Furthermore, the side surface of the substrate 21 may include an inclined surface L1 connecting the perpendicular surface C to the upper surface of the substrate 21. These inclined surfaces L1, L2 may be formed by laser scribing and the perpendicular surface C may be formed by cracking. The inclined surfaces L1, L2 may be formed on four sides of the substrate 21, without being limited thereto. Alternatively, the inclined surfaces L1, L2 may be formed only on two opposite sides of the substrate 21.

The substrate 21 may include a surface texture R on the lower surface thereof. The surface texture R improves light extraction efficiency of the light emitting diode. The shape of the side surface and the surface texture of the substrate 21 will be described in more detail below.

The first conductivity-type semiconductor layer 23 is disposed on the upper surface of the substrate 21. The first conductivity-type semiconductor layer 23 is grown on the substrate 21 and is a GaN-based semiconductor layer. The first conductivity-type semiconductor layer 23 may be a GaN-based semiconductor layer doped with n-type dopants, for example, Si. The first conductivity-type semiconductor layer 23 may have a dopant concentration of, for example, $1E19/cm^3$ to $2E19/cm^3$.

A mesa M is disposed on the first conductivity-type semiconductor layer. The mesa M may be restrictively placed inside a region surrounded by the first conductivity-type semiconductor layer 23 such that regions of the first conductivity-type semiconductor layer near an edge thereof are exposed to the outside instead of being covered by the mesa M.

The mesa M includes the second conductivity-type semiconductor layer 27 and the active layer 25. The active layer 25 is interposed between the first conductivity-type semiconductor layer 23 and the second conductivity-type semiconductor layer 27. The active layer 25 may have a single quantum well structure or a multi-quantum well structure. The composition and thickness of a well layer in the active layer 25 determines the wavelength of light generated from the active layer. In particular, the active layer may be adapted to generate UV light, blue light or green light through regulation of the composition of the well layer.

The second conductivity-type semiconductor layer 27 may be a GaN-based semiconductor layer doped with p-type dopants, for example, Mg. Each of the first conductivity-type semiconductor layer 23 and the second conductivity-type semiconductor layer 27 may be composed of a single layer or multiple layers, and may include super lattice layers, without being limited to a particular one.

The mesa M may include fingers F and a palm P. An indentation is formed between the fingers F and exposes an upper surface of the first conductivity-type semiconductor layer 23. Although the mesa M is illustrated as including the fingers F and the palm P in this exemplary embodiment, it should be understood that the present disclosure is not limited thereto. For example, the mesa M may have a quadrangular shape similar to the shape of the substrate 21 and may include through-holes formed therein to expose the first conductivity-type semiconductor layer 23. In addition, although the mesa is illustrated as including three fingers F in this exemplary embodiment, the number of fingers F is not limited thereto and may be two or four or more.

The second contact layer 31 is disposed on the mesa M to contact the second conductivity-type semiconductor layer 27. The second contact layer 31 may be disposed over the entire region of the mesa M in an upper region of the mesa M. For example, the second contact layer 31 may cover 80% or more of the upper region of the mesa M, for example, 90% or more thereof.

The second contact layer 31 may include a reflective metal layer and thus can reflect light, which is generated from the active layer 25 and travels towards the second contact layer 31, towards the substrate 21. Alternatively, the second contact layer 31 may be a transparent oxide layer, such as an indium tin oxide (ITO) layer or a ZnO layer.

A pre-insulation layer 29 may cover the mesa M around the second contact layer 31. The pre-insulation layer 29 may be formed of, for example, $SiO_2$, and may cover a side surface of the mesa M and some regions of the first conductivity-type semiconductor layer 23.

The first contact layer 35a covers the upper region of the mesa M. The first contact layer 35a includes inner contact portions 35a1 and an outer contact portion 35a2 contacting the first conductivity-type semiconductor layer 23. The outer contact portion 35a2 contacts the first conductivity-type semiconductor layer 23 near the edge of the substrate 21 along the mesa M, and the inner contact portions 35a1 contact the first conductivity-type semiconductor layer 23 in a region surrounded by the outer contact portion 35a2f. As shown in FIG. 1A and better shown in FIG. 7A, the inner contact portions 35a1 may be connected to the outer contact portion 35a2. Alternatively, the inner contact portions 35a1 may be separated from the outer contact portion 35a2.

The first contact layer 35a may have an opening in the upper region of the mesa M and an intermediate connecting portion 35b may be disposed inside the opening thereof. The intermediate connecting portion 35b may be formed together with the first contact layer 35a.

The lower insulation layer 33 may be interposed between the first contact layer 35a and the mesa M to insulate the first contact layer 35a from the mesa M and the second contact layer 31. In addition, the lower insulation layer 33 covers the pre-insulation layer 29 and has openings exposing the first conductivity-type semiconductor layer 23. The openings formed in the lower insulation layer 33 and the pre-insulation layer 29 may define regions for the outer contact portion 35a2 and the inner contact portions 35a1 described above. The lower insulation layer 33 may be interposed between the intermediate connecting portion 35b and the second contact layer 31 and may have openings (indicated by a circular dotted line), which expose the second contact layer 31. The intermediate connecting portion 35b may be connected to the second contact layer 31 through these openings.

The upper insulation layer 37 is disposed on the first contact layer 35a and the intermediate connecting portion 35b, and has an opening 37a exposing the first contact layer 35a and an opening 37b exposing the intermediate connecting portion 35b. The upper insulation layer 37 covers the inclined surface L1 of the substrate 21 and also covers a side surface of the first conductivity-type semiconductor layer 23 disposed on the substrate 21. In addition, the upper insulation layer 37 may cover a sidewall of the opening of the first contact layer 35a and a side wall of the intermediate connecting portion 35b.

Each of the lower insulation layer 33 and the upper insulation layer 37 may be composed of a single layer of $SiO_2$, without being limited thereto. For example, the lower insulation layer 33 or the upper insulation layer 37 may have a multilayer structure including a silicon nitride layer and a silicon oxide layer, and may be a distributed Bragg reflector in which silicon oxide layers and titanium oxide layers are alternately stacked one above another.

The first electrode pad is electrically connected to the first contact layer 35a through the opening 37a of the upper insulation layer 37 and the second electrode pad is electrically connected to the intermediate connecting portion 35b through the opening 37b thereof. Accordingly, the second electrode pad may be electrically connected to the second contact layer 31 through the intermediate connecting portion 35b.

FIGS. 1A and 1B schematically show the light emitting diode according to the exemplary embodiment for convenience of description and the structure and components of the light emitting diode will be more clearly understood through a method of manufacturing the light emitting diode described hereinafter.

FIGS. 2A, 2B, 3A, 3B, 4A, 4B, 5A, 5B, 6A, 6B, 7A, 7B, 8A, 8B, 9A, 9B, 10A, 10B, 11A, 11B, and 12 are views illustrating a method of manufacturing the light emitting diode according to the exemplary embodiment of the present disclosure, in which FIGS. 2A, 3A, 4A, 5A, 6A, 7A, 8A, 9A, 10A and 11A are plan views and FIGS. 2B, 3B, 4B, 5B, 6B, 7B, 8B, 9B, 10B and 11B are cross-sectional views taken along lines B-B in corresponding plan views, respectively.

Figure 2A:
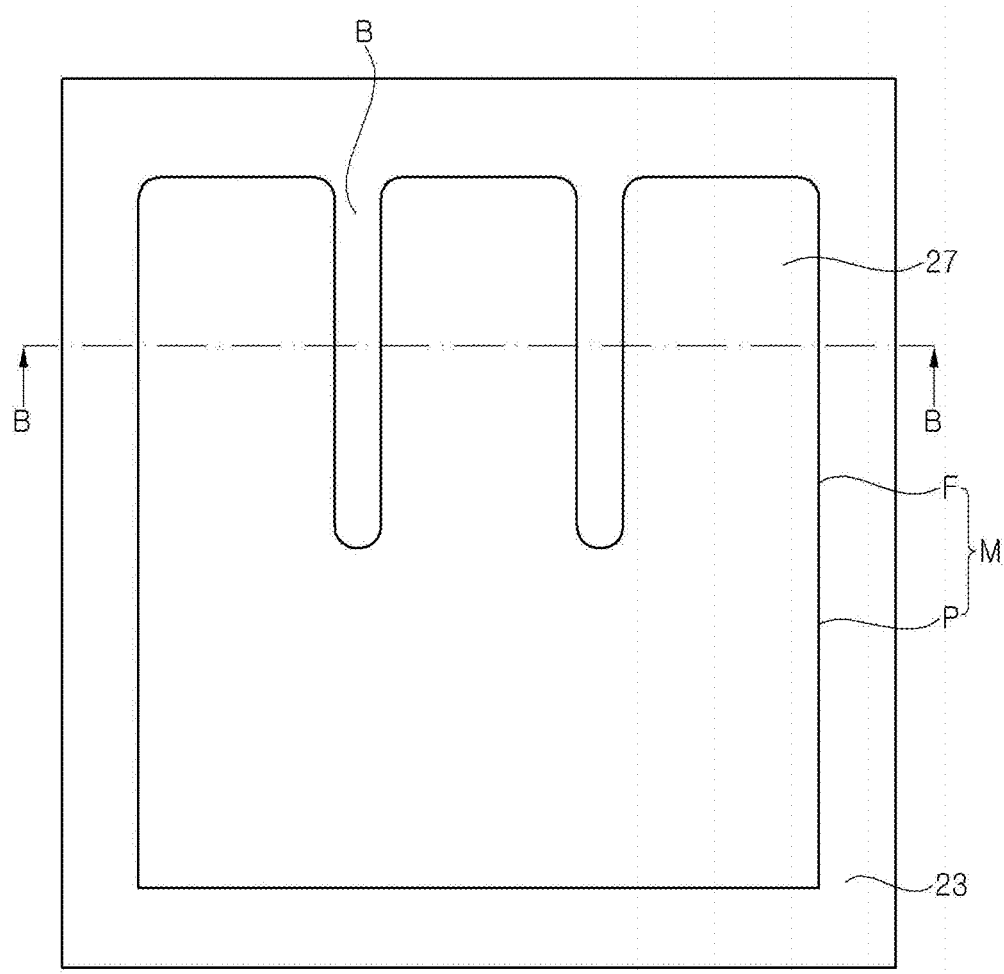
FIGS. 2A, 2B, 3A, 3B, 4A, 4B, 5A, 5B, 6A, 6B, 7A, 7B, 8A, 8B, 9A, 9B, 10A, 10B, 11A, and 11B are schematic plan views and schematic cross-sectional views illustrating a method of manufacturing the light emitting diode according to the exemplary embodiment of the present disclosure.
Figure 2B:
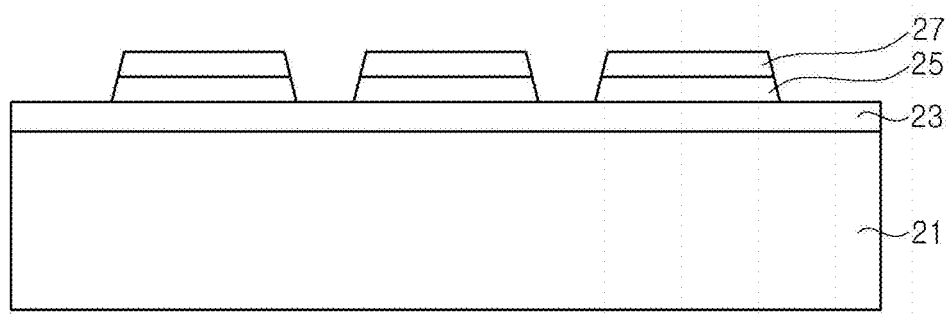

First, referring to FIGS. 2A and 2B, a first conductivity-type semiconductor layer 23, an active layer 25 and a second conductivity-type semiconductor layer 27 are grown on a substrate 21. The substrate 21 is a gallium nitride substrate and may be a polar, non-polar or semi-polar substrate. For example, the substrate 21 may have the c-plane, the m-plane or the a-plane as a growth plane. The substrate 21 may be formed by growing a gallium nitride ingot through an ammonothermal growth method, a flux method or a hydride vapor phase epitaxy (HVPE), followed by cutting the gallium nitride ingot to a thickness of about 300 μm or more. By this method, the gallium nitride substrate can be formed to have a low dislocation density.

The first conductivity-type semiconductor layer 23 may include, for example, an n-type gallium nitride layer and the second conductivity-type semiconductor layer 27 may include, for example, a p-type gallium nitride layer. The active layer 25 may include a single quantum well structure or a multi-quantum well structure, and may include a well layer and a barrier layer. Here, compositional elements of the well layer can be selected depending upon a desired wavelength of light and the well layer may include, for example, InGaN.

The first conductivity-type semiconductor layer 23, the active layer 25 and the second conductivity-type semiconductor layer 27 may be grown on the gallium nitride substrate 21 by metal organic chemical vapor deposition (MOCVD). Here, the first conductivity-type semiconductor layer 23 may be doped with n-type dopants, for example, Si, in a dopant concentration of $8E17/cm^3$ or more. Specifically, the first conductivity-type semiconductor layer 23 may have a dopant concentration of $8E17/cm^3$ to $1E18/cm^3$. The first conductivity-type semiconductor layer 23 has a higher dopant concentration than the gallium nitride substrate 21 and thus can be distinguished from the gallium nitride substrate 21 by the dopant concentration.

Then, a mesa M is formed on the first conductivity-type semiconductor layer 23 by patterning the second conductivity-type semiconductor layer 27 and the active layer 25. The mesa M includes the active layer 25 and the second conductivity-type semiconductor layer 27 and may also include some thickness of the first conductivity-type semiconductor layer 23. In addition, the mesa M is disposed inside a peripheral region of the first conductivity-type semiconductor layer 23 and may include fingers F and a palm P. As shown in FIG. 2A, the mesa M may include three fingers F, without being limited thereto. Alternatively, the mesa M may include two or four or more fingers. Accordingly, the first conductivity-type semiconductor layer 23 is exposed around the mesa M and an indentation B is disposed between the fingers F. The indentation B may be indented to about ½ the length of one side of the mesa M, without being limited thereto. Accordingly, the fingers F may have substantially the same length as the palm P. With the arrangement of the fingers F and the palm P, the second conductivity-type semiconductor layer 27 can be integrally connected, thereby simplifying subsequent processes for current spreading.

The side surface of the mesa M may be formed at an angle by a photoresist reflow process or the like. An inclined profile of the side surface of the mesa M improves efficiency in extraction of light generated from the active layer 25.

Figure 3A:
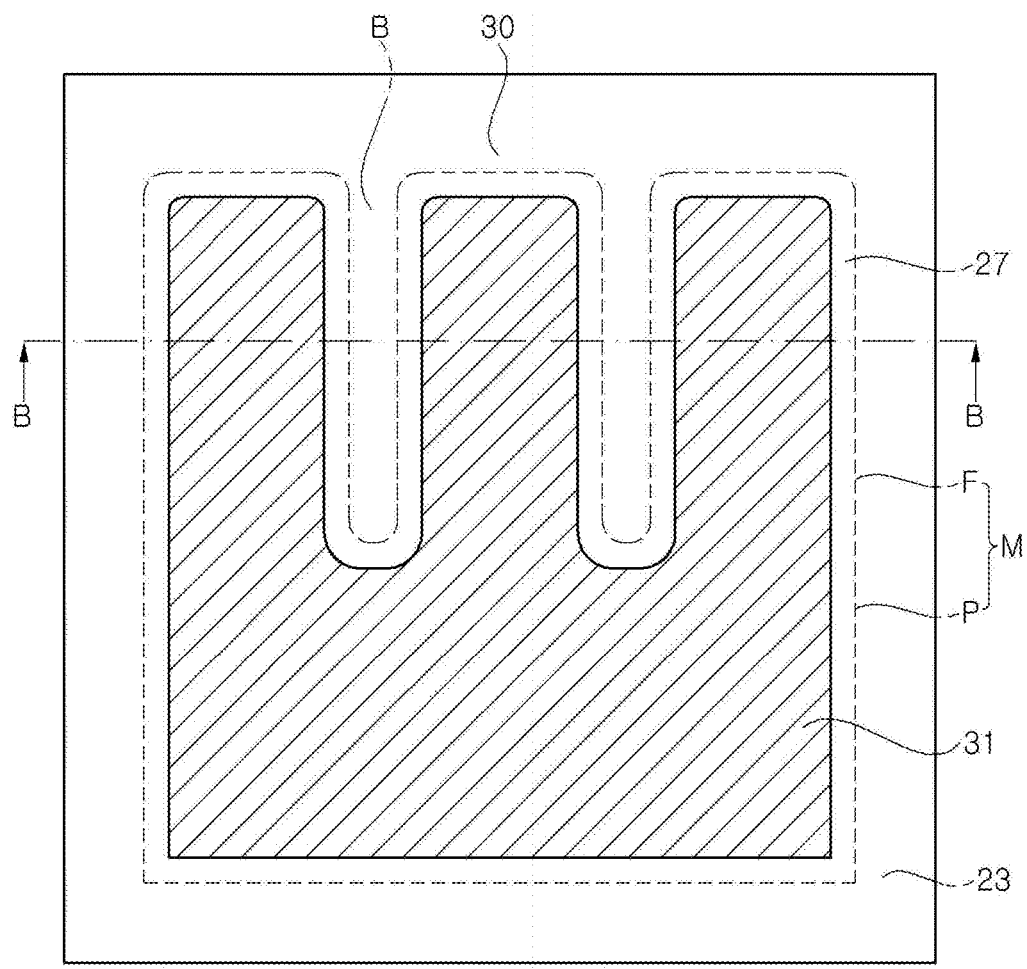
Figure 3B:
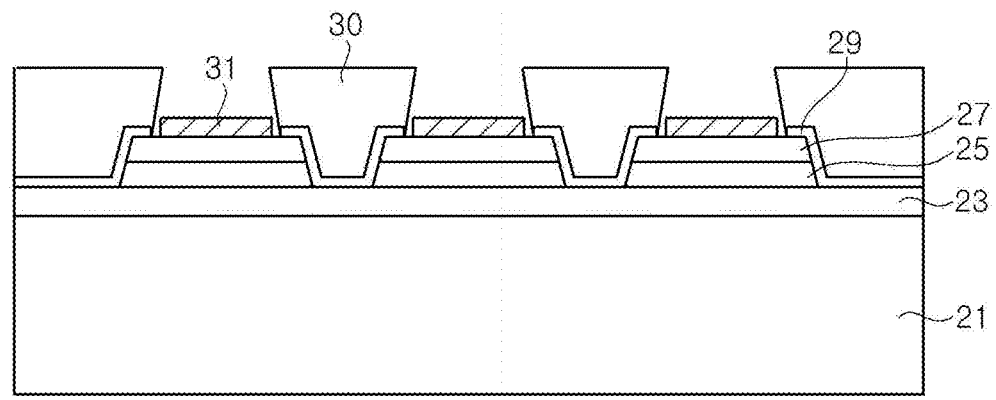

Referring to FIGS. 3A and 3B, a pre-insulation layer 29 is formed to cover the first conductivity-type semiconductor layer 23 and the mesa M. The pre-insulation layer 29 may be formed of $SiO_2$ through, for example, chemical vapor deposition.

A photoresist pattern 30 is formed on the pre-insulation layer 29. The photoresist pattern 30 has an opening which exposes an upper region of the mesa M. Although the opening has a substantially similar shape to the shape of the mesa M, the opening may have a slightly smaller size than the mesa M. That is, a photoresist may cover edges of the mesa M. In addition, the opening may be formed such that the bottom of the opening has a greater width than an inlet thereof. For example, the photoresist pattern 30 having such an opening can be easily formed using a negative type photoresist.

Then, the pre-insulation layer 29 is subjected to etching using the photoresist pattern 30 as an etching mask to expose the second conductivity-type semiconductor layer 27. The pre-insulation layer 29 may be subjected to etching, for example, wet etching.

Thereafter, a second contact layer 31 is formed. The second contact layer 31 may be formed on the mesa M by a coating technique using e-beam evaporation.

Figure 4A:
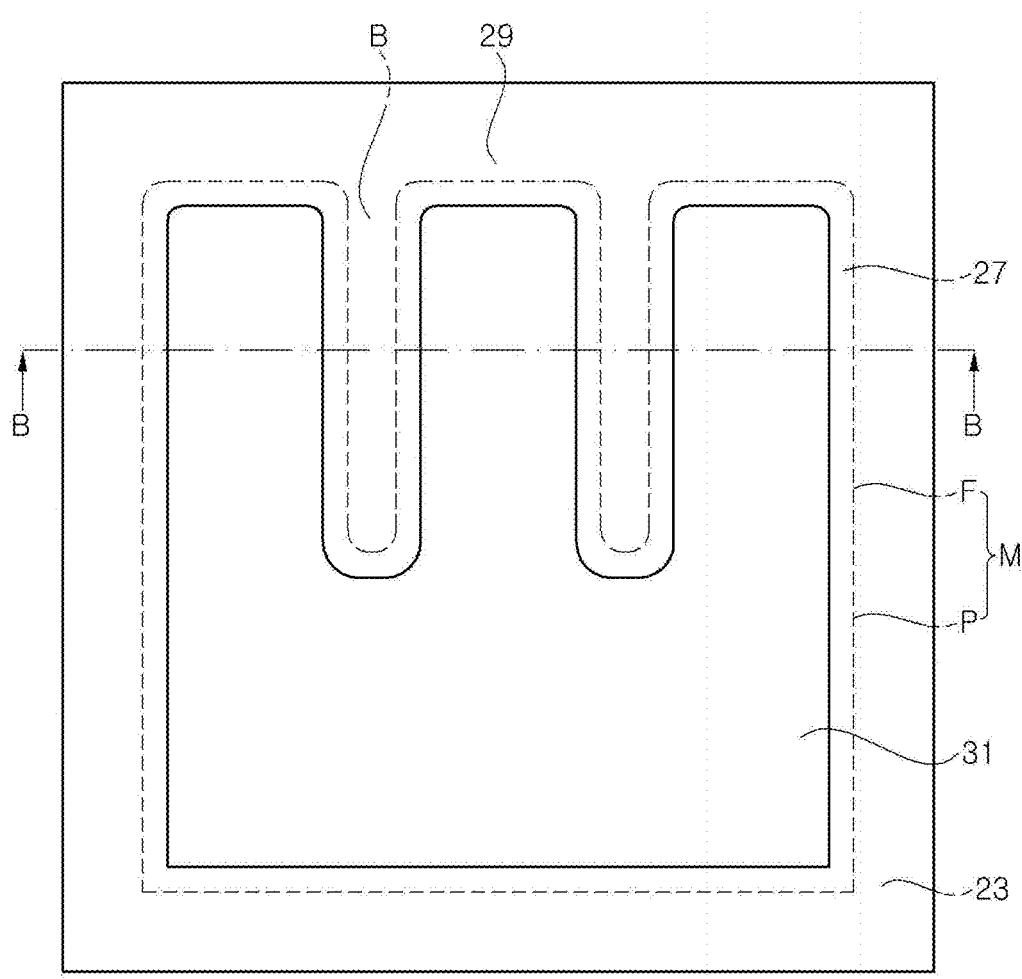
Figure 4B:
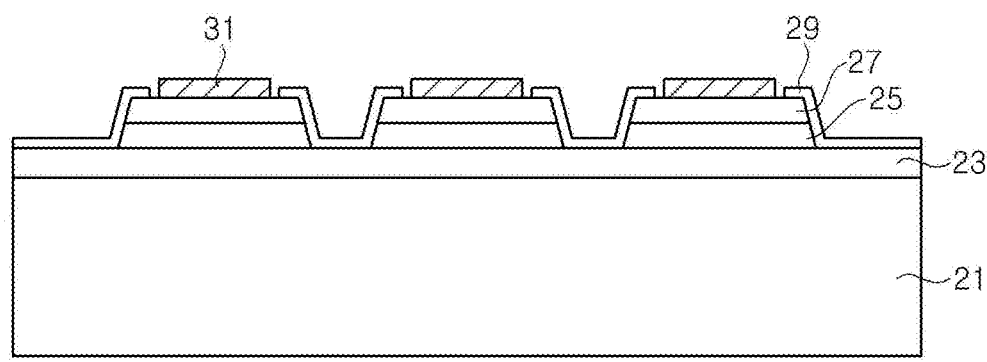

Referring to FIGS. 4A and 4B, the photoresist pattern 30 is removed. Here, a material deposited on the photoresist is also removed together with the photoresist pattern 30. Accordingly, the second contact layer 31 remains on the mesa M to contact the second conductivity-type semiconductor layer 27 and the pre-insulation layer 29 remains around the second contact layer 31. The pre-insulation layer 29 may also cover an exposed portion of the first conductivity-type semiconductor layer 23.

Here, the second contact layer 31 may be composed of a single metallic material layer or multiple layers. For example, the second contact layer 31 may include a reflective layer, a capping layer and an anti-oxidation layer. In addition, a stress relieving layer may be interposed between the reflective layer and the capping layer.

The reflective layer may be formed of, for example, Ni/Ag/Ni/Au, and the capping layer covers upper and side surfaces of the reflective layer to protect the reflective layer. The reflective layer may be formed by e-beam evaporation and the capping layer may be formed by sputtering or e-beam evaporation (for example, planetary e-beam evaporation), in which vacuum deposition is performed while rotating the substrate in a slanted state. The capping layer may include Ni, Pt, Ti, or Cr and may be formed by, for example, depositing at least one pair of Ni/Pt layers or at least one pair of Ni/Ti layers. Alternatively, the capping layer may include TiW, W, or Mo.

The stress relieving layer is interposed between the reflective layer and the capping layer to relieve stress and thus may be selected in various ways depending upon the metallic materials of the reflective layer and the capping layer. For example, when the reflective layer includes Al or Al alloys and the capping layer includes W, TiW or Mo, the stress relieving layer may be a single layer of Ag, Cu, Ni, Pt, Ti, Rh, Pd or Cr, or a combined layer of Cu, Ni, Pt, Ti, Rh, Pd or Au. Alternatively, when the reflective layer includes Al or Al alloys and the capping layer includes Cr, Pt, Rh, Pd or Ni, the stress relieving layer may be a single layer of Ag or Cu, or a combined layer of Ni, Au, Cu or Ag.

Alternatively, when the reflective layer includes Ag or Ag alloys and the capping layer 32 includes W, TiW or Mo, the stress relieving layer may be a single layer of Cu, Ni, Pt, Ti, Rh, Pd or Cr, or a combined layer of Cu, Ni, Pt, Ti, Rh, Pd, Cr or Au. Alternatively, when the reflective layer includes Ag or Ag alloys and the capping layer 32 includes Cr or Ni, the stress relieving layer may be a single layer of Cu, Cr, Rh, Pd, TiW, or Ti, or a combined layer of Ni, Au or Cu.

In addition, the anti-oxidation layer includes Au to prevent oxidation of the capping layer and may be formed of, for example, Au/Ni or Au/Ti. Since Ti exhibits good bonding strength with respect to an oxide layer such as $SiO_2$, Ti is preferred. The anti-oxidation layer may be formed by sputtering or e-beam evaporation (for example, planetary e-beam evaporation), in which vacuum deposition is performed while rotating the substrate 21 in a slanted state.

Although the second contact layer 31 is illustrated as a metal layer in this exemplary embodiment, it should be understood that the present disclosure is not limited thereto. The second contact layer 31 may be formed of any material capable of forming ohmic contact with the second conductivity-type semiconductor layer 27. For example, the second contact layer 31 may be a transparent conductive layer such as ITO or ZnO.

Figure 5A:
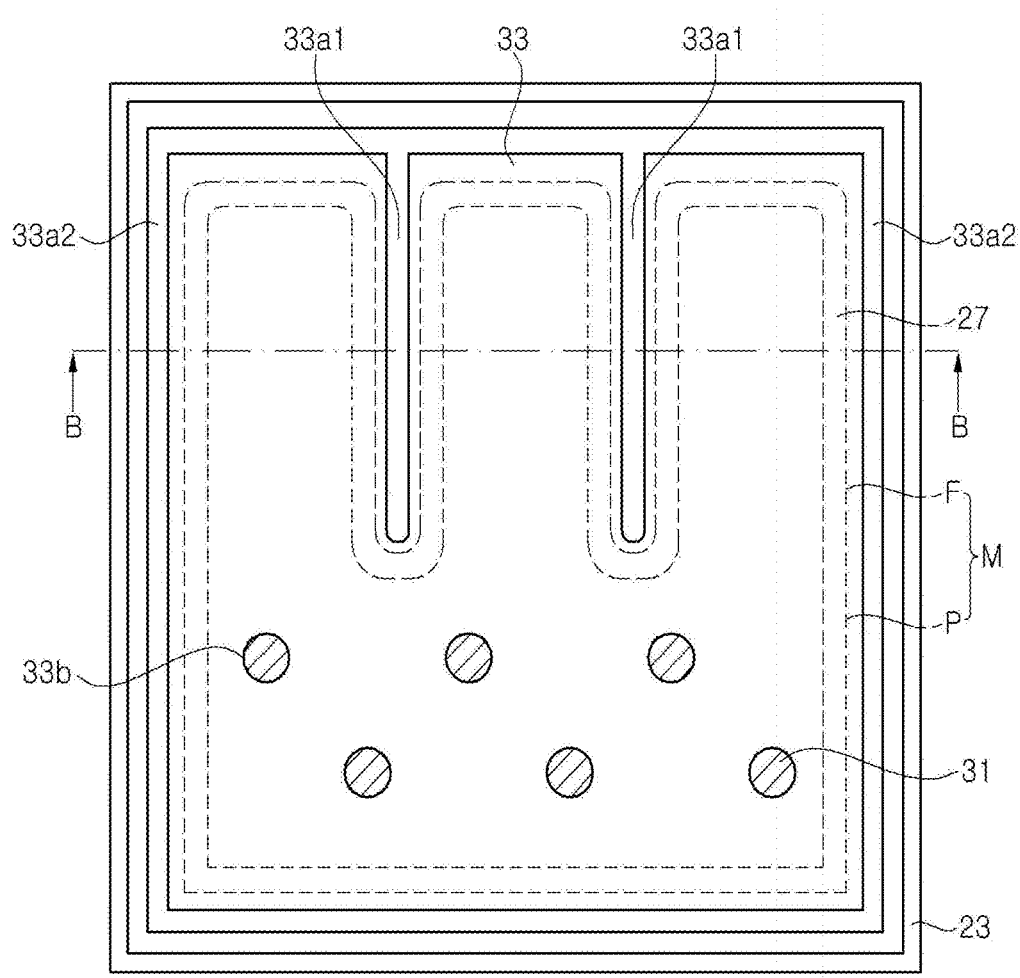
Figure 5B:
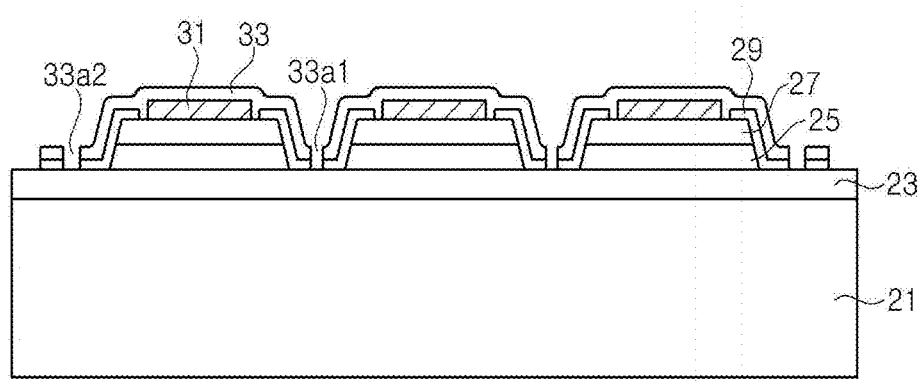

Referring to FIGS. 5A and 5B, a lower insulation layer 33 is formed to cover the mesa M and the first conductivity-type semiconductor layer 23. The lower insulation layer 33 covers the second contact layer 31 and the pre-insulation layer 29. On the other hand, the lower insulation layer 33 includes openings 33a1, 33a2 for electrical connection to the first conductivity-type semiconductor layer 23 in a particular region and openings 33b for electrical connection to the second contact layer 31 in a particular region. The openings 33a1, 33a2 may be formed through the lower insulation layer 33 and the pre-insulation layer 29. The openings 33b are placed on the second contact layer 31.

The openings 33a1 are disposed between the fingers F to expose the first conductivity-type semiconductor layer 23. In addition, the opening 33a2 is formed near an edge of the substrate 21 along the circumference of the mesa M. The opening 33a2 may be connected to the openings 33a1 or may be separated therefrom.

The openings 33b are disposed on the palm P of the mesa M. The number of openings 33b is not particularly limited and may be one or more.

The lower insulation layer 33 may be formed of an oxide layer such as $SiO_2$, a nitride layer such as $SiN_x$, or an insulation layer such as $MgF_2$ by chemical vapor deposition (CVD) or others, and the openings 33a1, 33a2, 33b may be formed by photolithography and etching. Furthermore, the lower insulation layer 33 near the edge of the first conductivity-type semiconductor layer 23 is removed to expose the first conductivity-type semiconductor layer. The lower insulation layer 33 may be removed by a distance of about 5 μm or more from the edge of the substrate 21.

The lower insulation layer 33 may be formed to a thickness of, for example, 4,000 Å to 12,000 Å, and may be composed of a single layer or multiple layers. Furthermore, the lower insulation layer 33 may include a distributed Bragg reflector (DBR) in which a material layer having a high index of refraction and a material having a low index of refraction are alternately stacked one above another. For example, an insulation reflective layer having high reflectance may be formed by stacking $SiO_2/TiO_2$ layers or $SiO_2/Nb_2O_5$ layers.

Figure 6A:
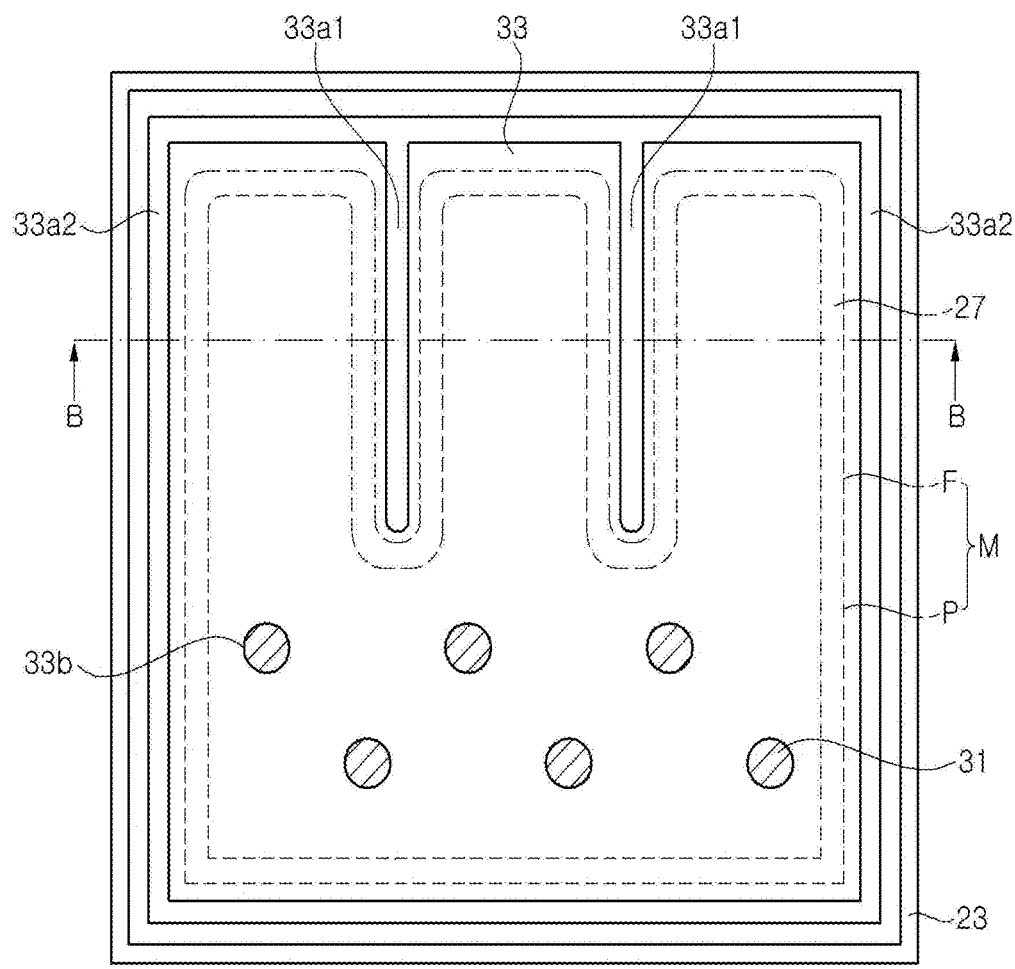
Figure 6B:
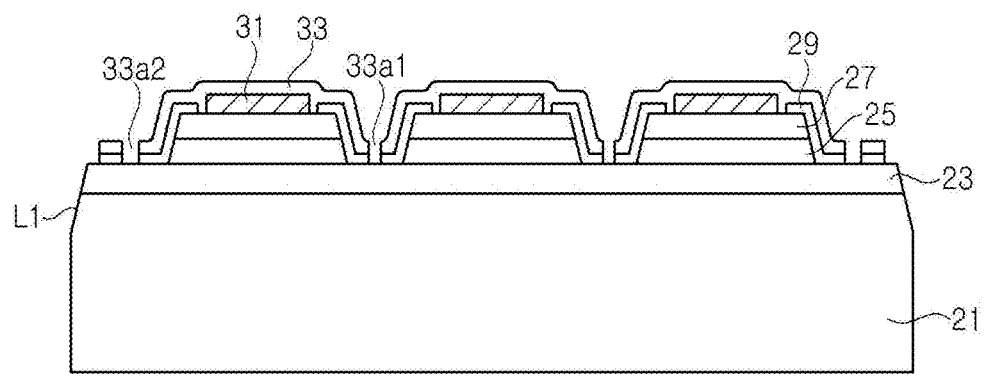

Referring to FIGS. 6A and 6B, a laser scribing process is performed on the edges of the first conductivity-type semiconductor layer 23 and the substrate 21. As a result, an inclined surface L1 is formed on the edge of the substrate 21. A scribing depth formed by laser scribing may range from about 30 μm to 50 μm. In addition, the width recessed from the edge of the substrate 21 by laser scribing may be about 5 μm or less.

Although the inclined surface L1 is formed in this exemplary embodiment, the inclined surface L1 may be omitted. Here, it should be noted that the inclined surface L1 facilitates a breaking or cracking process and provides an effect of protecting the first conductivity-type semiconductor layer 23 from external environments by covering the side surface of the first conductivity-type semiconductor layer 23 with an upper insulation layer 37 described below. On the other hand, contaminants may be removed from the side surface of the substrate 21 using chemicals, such as phosphoric acid, after laser scribing.

Figure 7A:
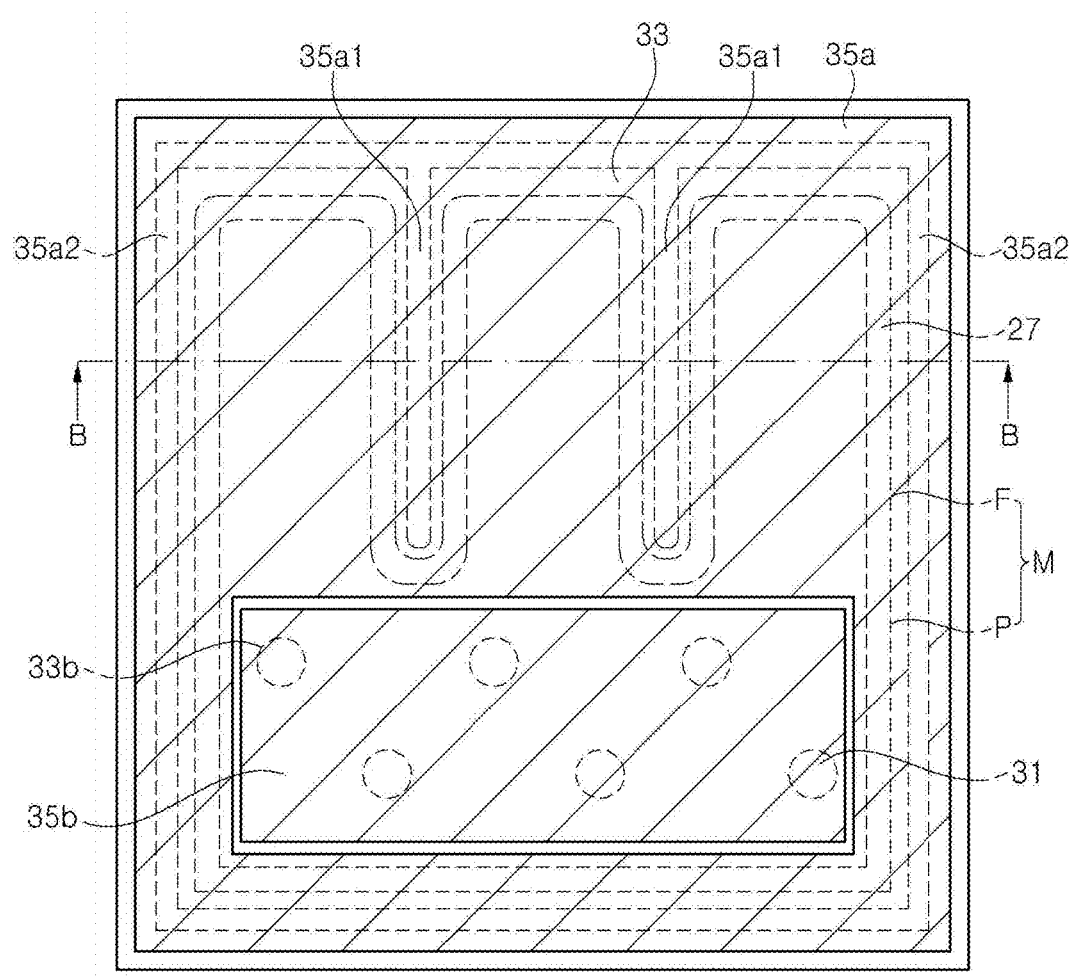
Figure 7B:
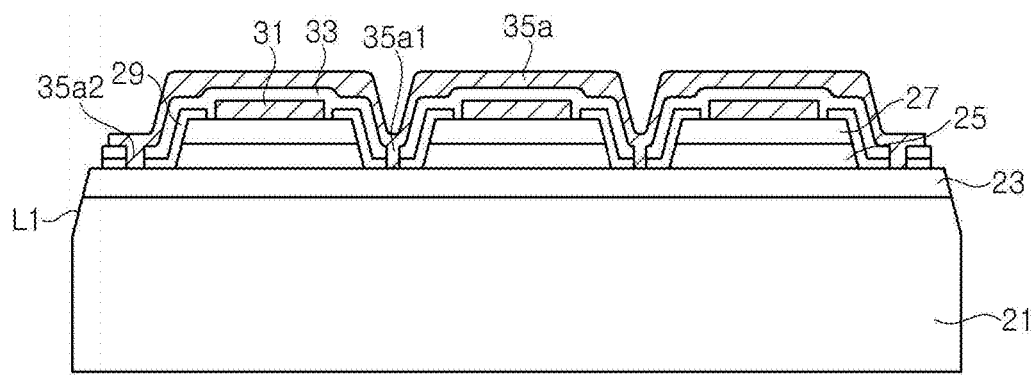

Referring to FIGS. 7A and 7B, a first contact layer 35a and an intermediate connecting portion 35b are formed on the lower insulation layer 33. The first contact layer 35a and the intermediate connecting portion 35b may be simultaneously formed of the same material by, for example, a lift-off process.

The first contact layer 35a covers most of an upper region of the first conductivity-type semiconductor layer 23 excluding a region in which the intermediate connecting portion 35b will be formed. The first contact layer 35a is insulated from the mesa M and the second contact layer 31 by the lower insulation layer 33. The first contact layer 35a has an opening surrounding the intermediate connecting portion 35b, and the intermediate connecting portion 35b is formed inside the opening.

In addition, the first contact layer 35a includes an inner contact portion 35a1, which contacts the first conductivity-type semiconductor layer 23 through the opening 33a1 of the lower insulation layer 33, and an outer contact portion 35a2, which contacts the first conductivity-type semiconductor layer 23 through the opening 33a2. The outer contact portion 35a2 contacts the first conductivity-type semiconductor layer 23 near the edge of the first conductivity-type semiconductor layer 23 along the circumference of the mesa M, and the inner contact portion 35a1 contacts the first conductivity-type semiconductor layer 23 in a region surrounded by the outer contact portion 35a2, particularly in a region between the fingers F. In particular, at least three fingers F may be formed and a plurality of inner contact portions 35a1 may be connected to the first conductivity-type semiconductor layer 23. Accordingly, the inner contact portions 35a1 are connected together with the outer contact portion 35a2 to various points of the first conductivity-type semiconductor layer 23, thereby facilitating current spreading.

The opening of the first contact layer 35a is formed to surround the openings 33b of the lower insulation layer 33 and the intermediate connecting portion 35b covers the openings 33b of the lower insulation layer 33. Accordingly, the intermediate connecting portion 35b is connected to the second contact layer 31 through the openings 33b of the lower insulation layer 33. The intermediate connecting portion 35b overlaps the second contact layer 31. Particularly, the intermediate connecting portion may be restrictively placed on the palm P of the mesa M.

According to this exemplary embodiment, the first contact layer 35a is formed substantially over the entire upper region of the first conductivity-type semiconductor layer 23 excluding the openings. Accordingly, electric current can be easily spread through the first contact layer 35a. The first contact layer 35a may include a highly reflective metal layer, such as an Al layer, which may be formed on a bonding layer such as a Ti, Cr or Ni layer. In addition, a protective layer composed of a single layer or combined layer of Ni, Cr, and Au may be formed on the highly reflective metal layer. The first contact layer 35a may have a multilayer structure of, for example, Cr/Al/Ni/Ti/Ni/Ti/Au/Ti.

Figure 8A:
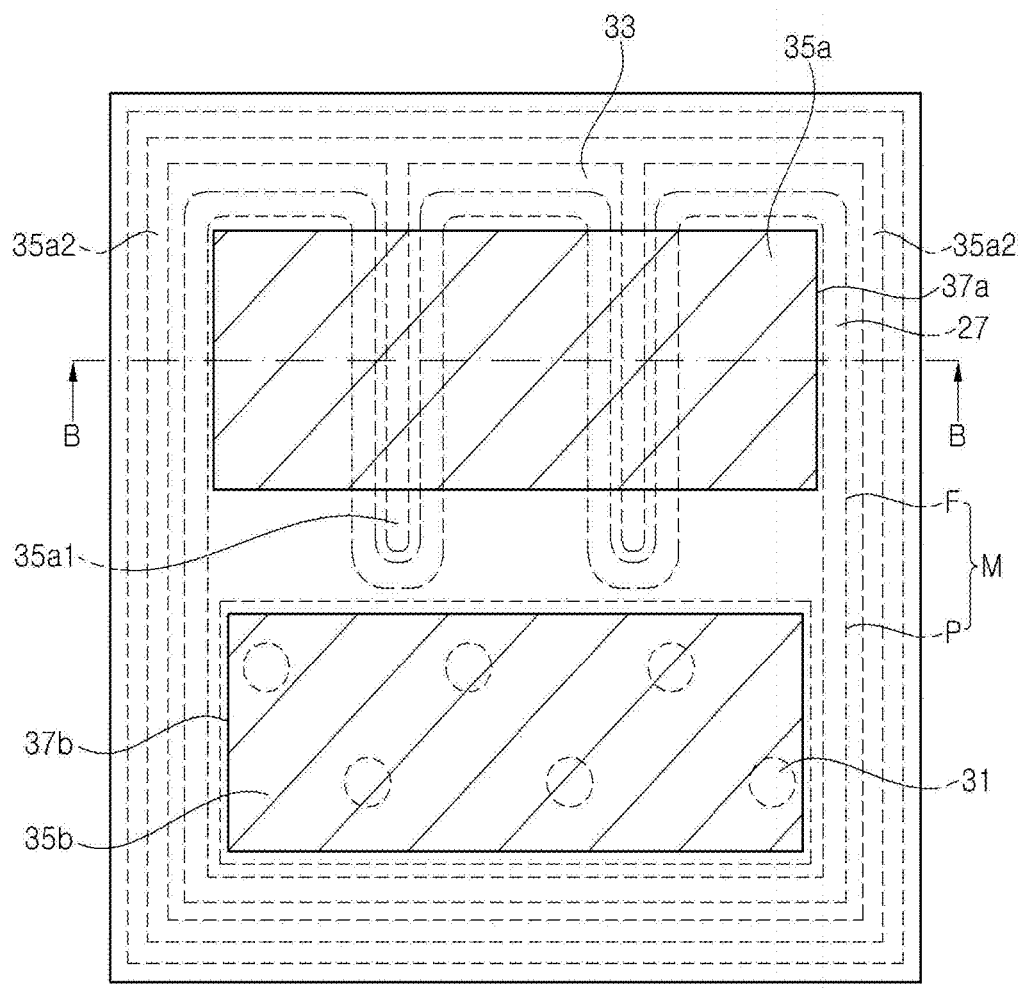
Figure 8B:
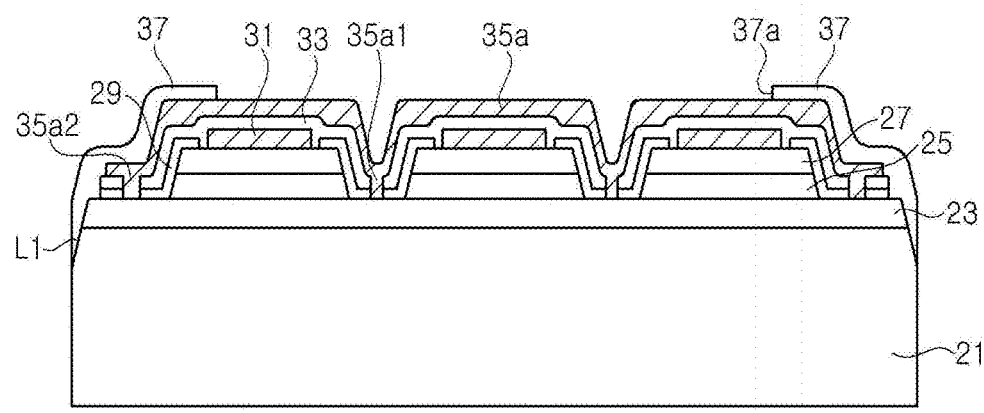

Referring to FIGS. 8A and 8B, an upper insulation layer 37 is formed on the first contact layer 35a. The upper insulation layer 37 has an opening 37a which exposes the first contact layer 35a, and an opening 37b which exposes the intermediate connecting portion 35b. The opening 37a may be formed to overlap the first contact layer 35a over the fingers F of the mesa M and the opening 37b may be formed on the intermediate connecting portion 35b to overlap the second contact layer 31 on the palm P of the mesa M.

The opening 37b is placed to overlap the second contact layer 31 and may have a smaller size than the intermediate connecting portion 35b. Accordingly, an edge and sidewall of the intermediate connecting portion 35b are covered by the upper insulation layer 37. Furthermore, a sidewall of the opening of the first contact layer 35a is also covered by the upper insulation layer 37.

The upper insulation layer 37 may be composed of a single layer of silicon nitride or silicon oxide, without being limited thereto. Alternatively, the upper insulation layer 37 may have a multilayer structure or a distributed Bragg reflector. The upper insulation layer 37 may cover the inclined surface L1 to cover the side surface of the first conductivity-type semiconductor layer 23.

Figure 9A:
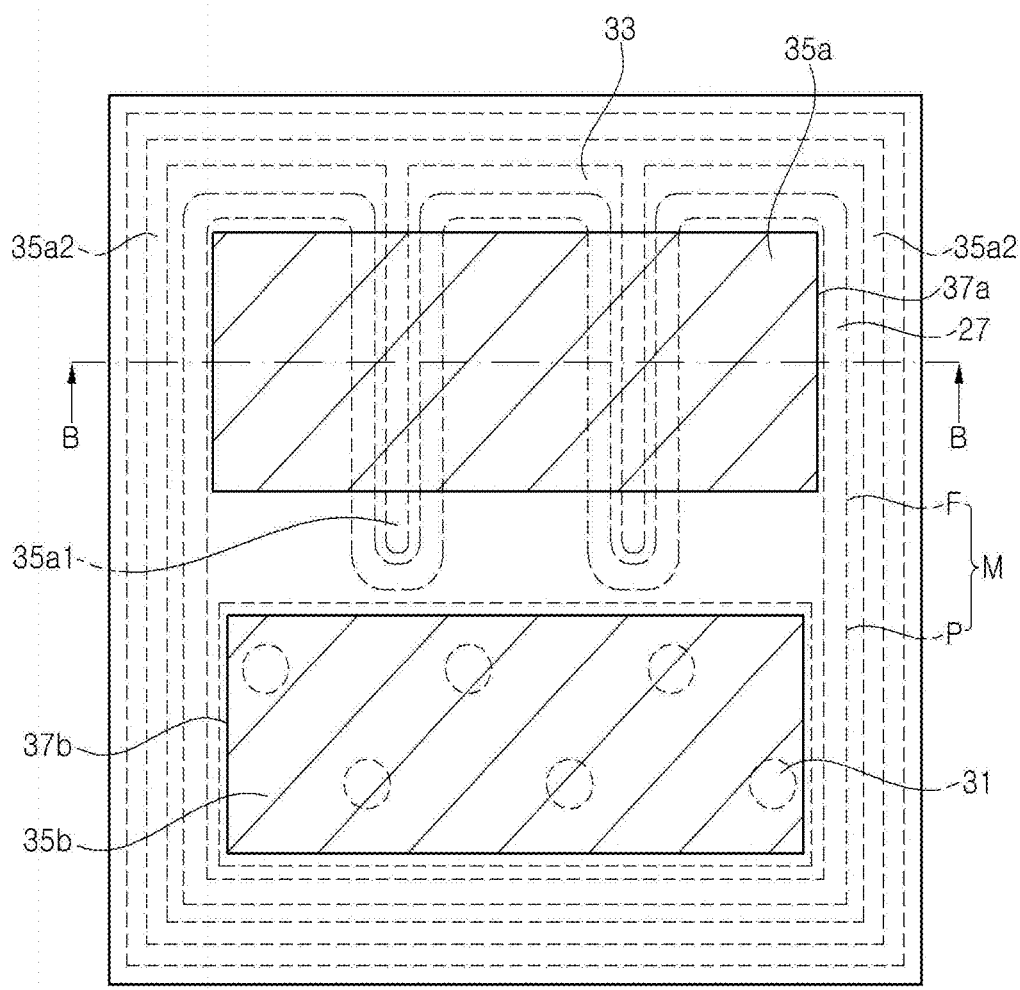
Figure 9B:
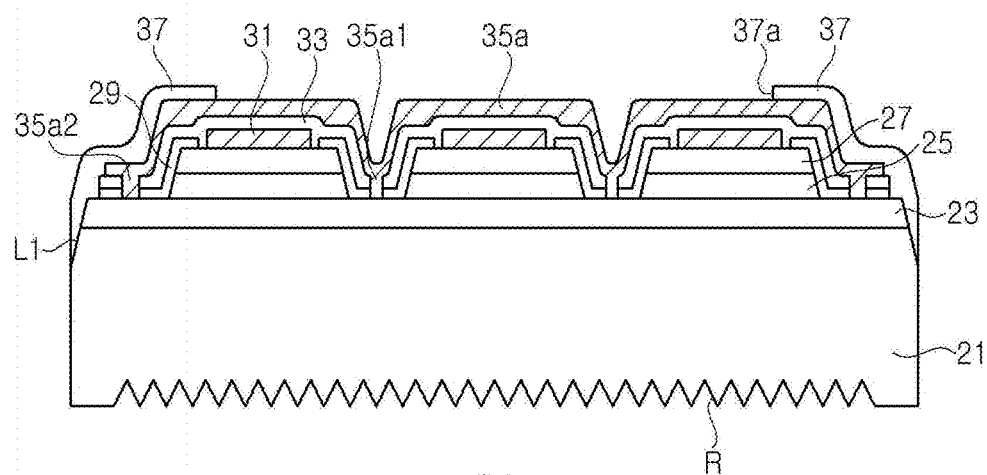

Referring to FIGS. 9A and 9B, a surface texture R is formed on the lower surface of the substrate 21. The surface texture R may be formed by forming a mask using a material, for example, $SiO_2$, which has a low dielectric permittivity, followed by dry etching the lower surface of the substrate 21 using the mask as an etching mask. The surface texture R may include, for example, a plurality of truncated cones, and a valley between the truncated cones may have a sharp shape. Further, the mask may remain on the truncated cones. The shape of the surface texture R will be described in detail below with reference to FIGS. 14A and 14B.

Figure 10A:
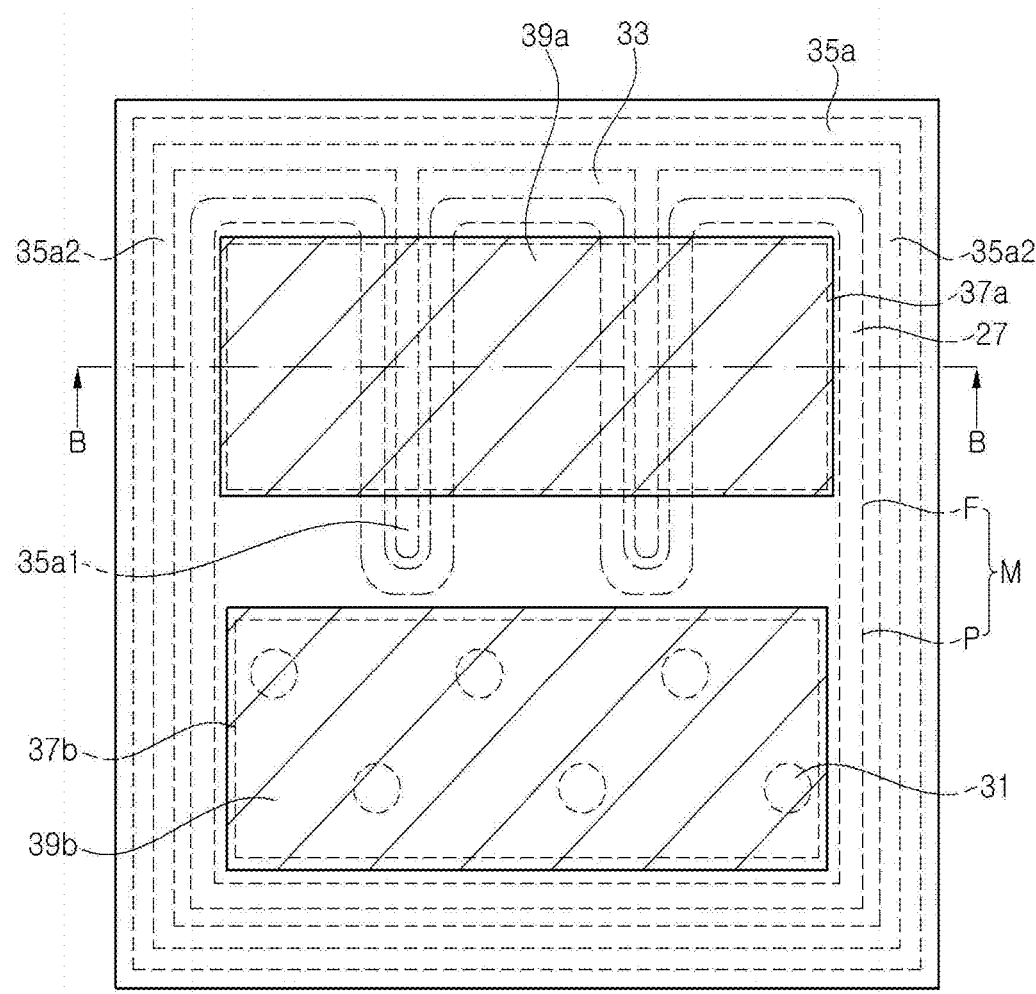
Figure 10B:
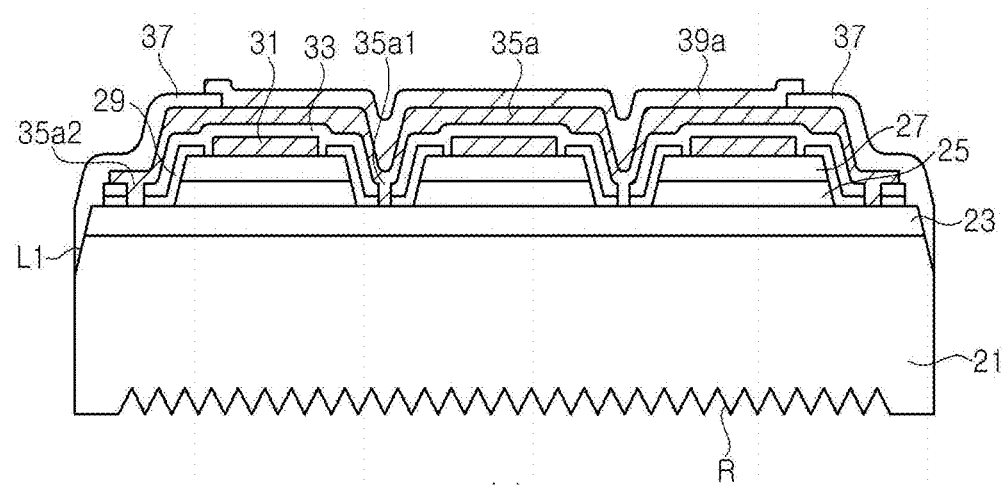

Referring to FIGS. 10A and 10B, a first electrode pad 39a and a second electrode pad 39b are formed on the upper insulation layer 37. The first electrode pad 39a is connected to the first contact layer 35a through the opening 37a of the upper insulation layer 37 and the second electrode pad 39b is connected to the intermediate connecting portion 35b to through the opening 37b of the upper insulation layer 37. The first electrode pad 39a and the second electrode pad 39b are used to mount the light emitting diode on a submount or a printed circuit board. The first electrode pad 39a and the second electrode pad 39b may be formed of AuSn and mounted on the submount or the like through eutectic bonding.

A distance D between the first and second electrode pads may be set to about 80 μm or more in order to prevent short circuit.

The first and second electrode pads 39a, 39b may be formed together by the same process, for example, a lift-off technique.

Figure 11A:
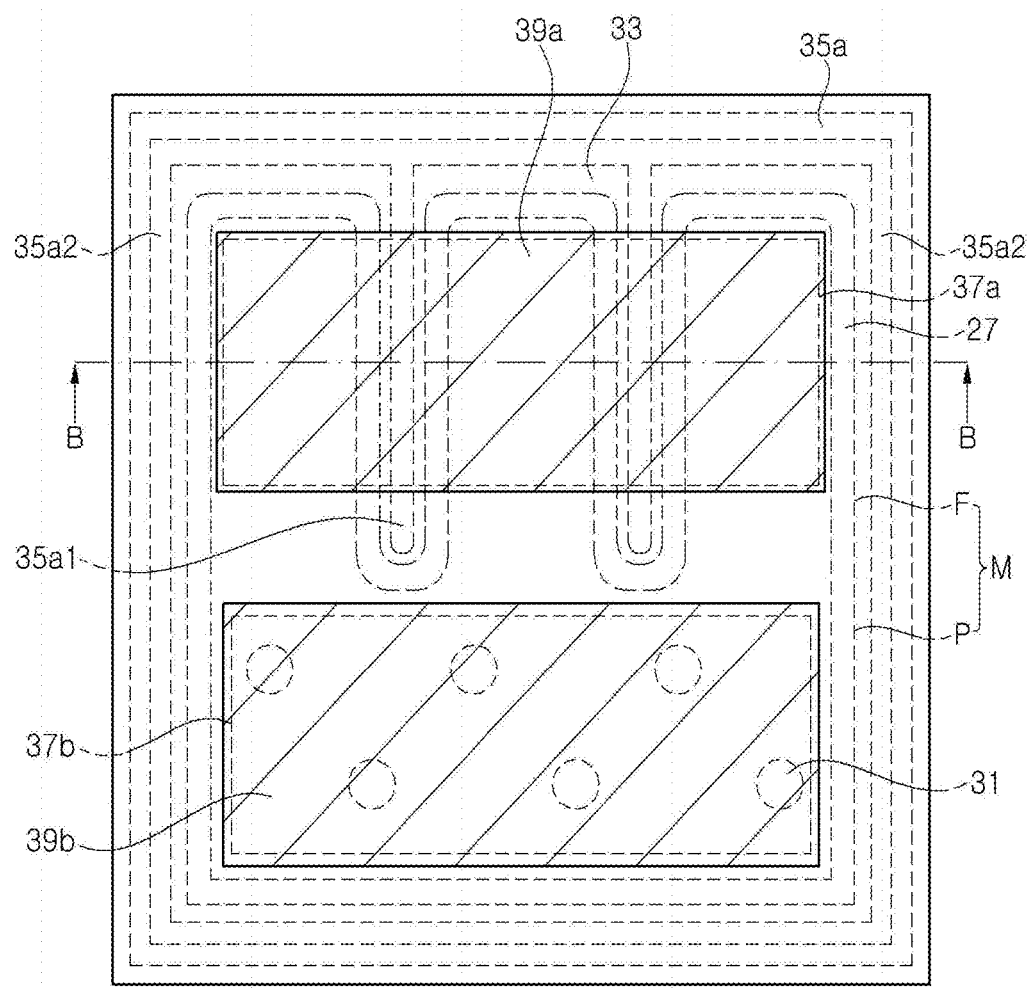
Figure 11B:
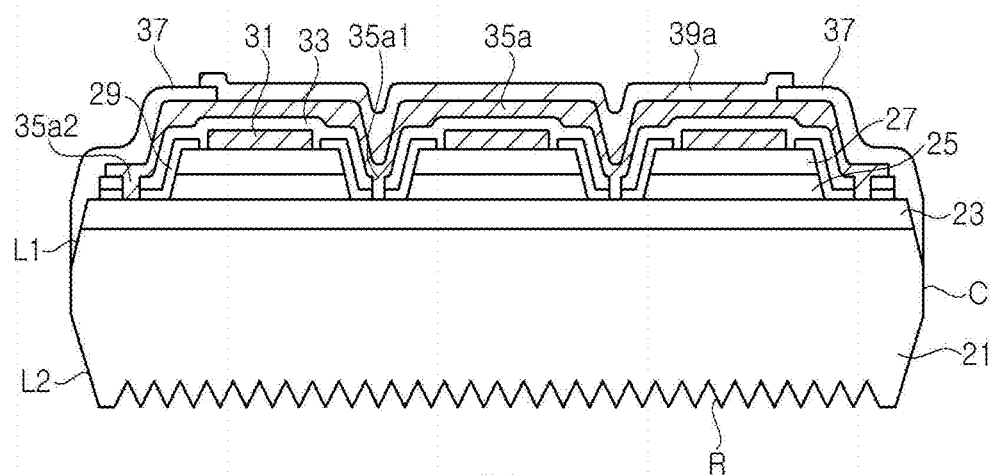

Referring to FIGS. 11A and 11B, an inclined surface L2 is formed on the lower surface of the substrate 21 by laser scribing. The inclined surface L2 is formed to face the inclined surface L1 formed on the upper surface of the substrate 21. A scribed depth formed by laser scribing may range from about 80 μm to about 100 μm. Accordingly, the thickness of the substrate between the inclined surface L1 and the inclined surface L2 may range from about 50 μm to about 200 μm. Contaminants may be removed from the side surface of the substrate 21 using chemicals, such as phosphoric acid, after laser scribing.

Then, the substrate 21 is divided corresponding to individual light emitting diodes by cracking, thereby providing divided light emitting diodes. By cracking, a cracked surface may be formed between the inclined surfaces L1 and L2 of the substrate 21.

Figure 12:
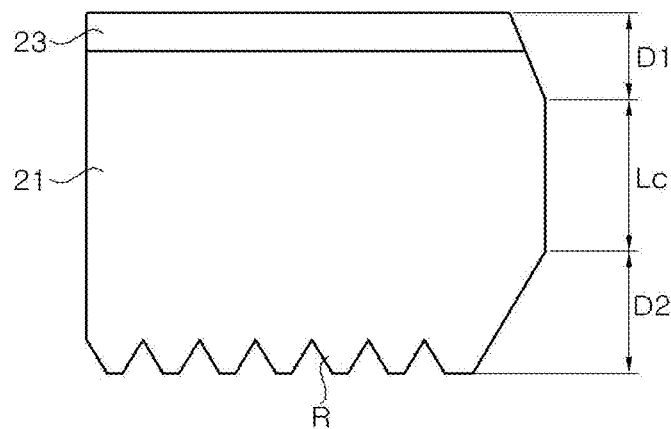
FIG. 12 is a schematic side view of a gallium nitride substrate of the light emitting diode according to the exemplary embodiment of the present disclosure.

In this exemplary embodiment, the inclined surfaces L1, L2 are formed by laser scribing and the cracked surface C is formed by cracking the substrate 21. FIG. 12 is a schematic enlarged sectional view of the inclined surfaces L1, L2 and the cracked surface C. As shown in FIG. 12, the cracked surface C may be formed to be substantially perpendicular to the upper surface of the substrate 21. The cracked surface C formed by cracking the substrate 21 may have a thickness of about 50 μm to about 200 μm. The structure wherein a portion of the substrate 21 subjected to cracking has a thickness of 200 μm or less can prevent generation of cracks in an undesired direction, thereby providing a light emitting diode having a desired quadrangular shape. So long as the portion of the substrate 21 subjected to cracking can have a thickness of 200 μm or less, the substrate 21 may have only one of the inclined surfaces L1, L2. Here, the inclined surface L2 is preferred to the inclined surface L1 in order to secure an area of an active region.

On the other hand, the inclined surface L1 formed on the upper surface of the substrate 21 may have a depth D1 of less than 50 μm, for example, in the range of about 30 μm to about 50 μm. In addition, a depression recessed from the cracked surface C on the upper surface of the substrate 21 by laser scribing may have a width of about 5 μm or less. Further, the inclined surface L2 formed on the lower surface of the substrate 21 has a depth D2 of 80 μm or more, for example, in the range of about 80 μm to about 100 μm. Further, a depression recessed from the cracked surface C on the upper surface of the substrate 21 by laser scribing may have a width of about 10 μm or less. These inclined surfaces L1, L2 are rougher than the cracked surface C, thereby improving light extraction efficiency through reduction in total internal reflection.

Although the inclined surfaces L1, L2 are illustrated as being inclined at a constant angle in this exemplary embodiment, it should be understood that the present disclosure is not limited thereto. Since the inclined surfaces L1, L2 are formed by laser scribing, the inclined surfaces L1, L2 may be recessed from the cracked surface C and be substantially perpendicular to the upper surface of the substrate 21 instead of being inclined at a constant angle. Here, the inclined surface L2 may be further recessed from the cracked surface C than the inclined surface L1.

Figure 13:
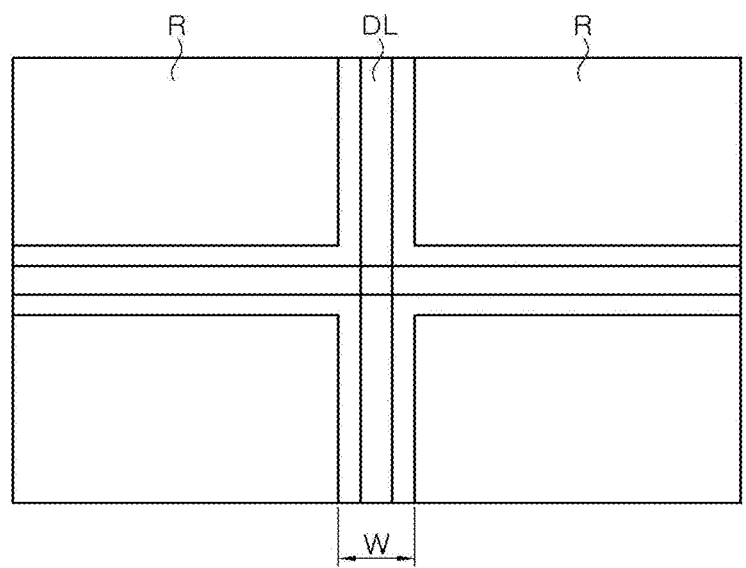
FIG. 13 is a schematic bottom view of the gallium nitride substrate, illustrating laser scribing lines on a lower surface of the gallium nitride substrate in the method of manufacturing the light emitting diode according to the exemplary embodiment of the present disclosure.

FIG. 13 is a schematic bottom view illustrating a laser scribing process performed on a wafer having a surface texture R to form the inclined surface L2.

Referring to FIG. 13, a plurality of light emitting diode regions is defined on a single wafer and surface textures R are formed on the lower surface of the substrate in each of the light emitting diode regions. The surface textures R are separated from each other such that a flat region remains therebetween. Laser scribing is performed by irradiating with a laser beam along the flat region between the surface textures R. The laser beam has a diameter of about 20 μm or less, thereby forming scribing lines DL having a width of about 20 μm or less. A width between the surface textures R may be 20 μm or more, specifically about 30 μm to 40 μm. The wafer is divided into individual light emitting diodes by cracking along the scribing lines DL. Accordingly, with the width between the surface textures R set to 40 μm or less, the surface textures formed on the lower surface of the substrate 21 of the light emitting diode can have an increase area, thereby improving light extraction efficiency.

Cracking may be performed substantially along the center of each of the scribing lines DL. Accordingly, in each of the light emitting diodes, the inclined surface L2 formed on the lower surface of the substrate 21 may have a recessed width that is about ½ the diameter of the laser beam.

Figure 14A:
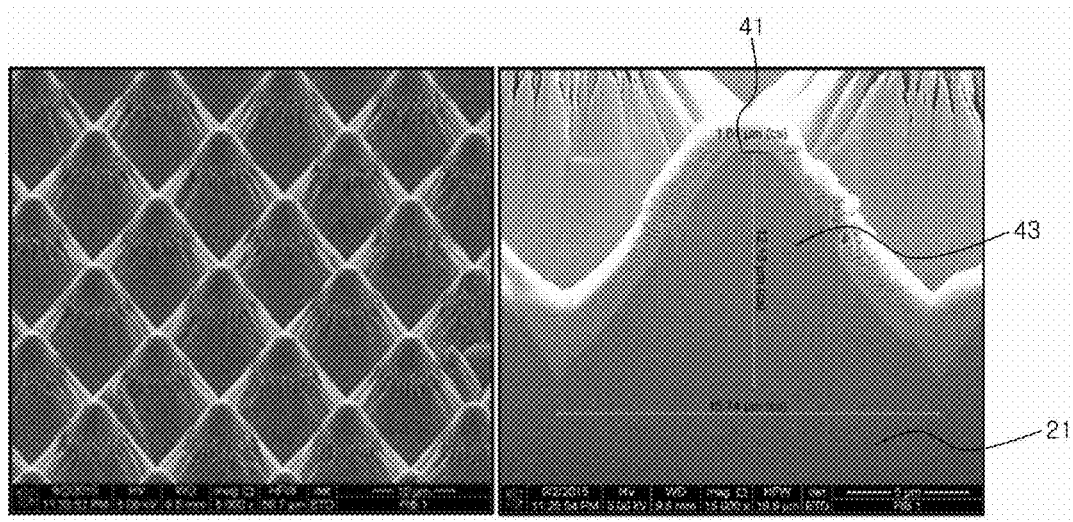
FIG. 14A shows scanning electron microscope (SEM) images illustrating a surface texture formed on the lower surface of the gallium nitride substrate of the light emitting diode according to the exemplary embodiment of the present disclosure.
Figure 14B:
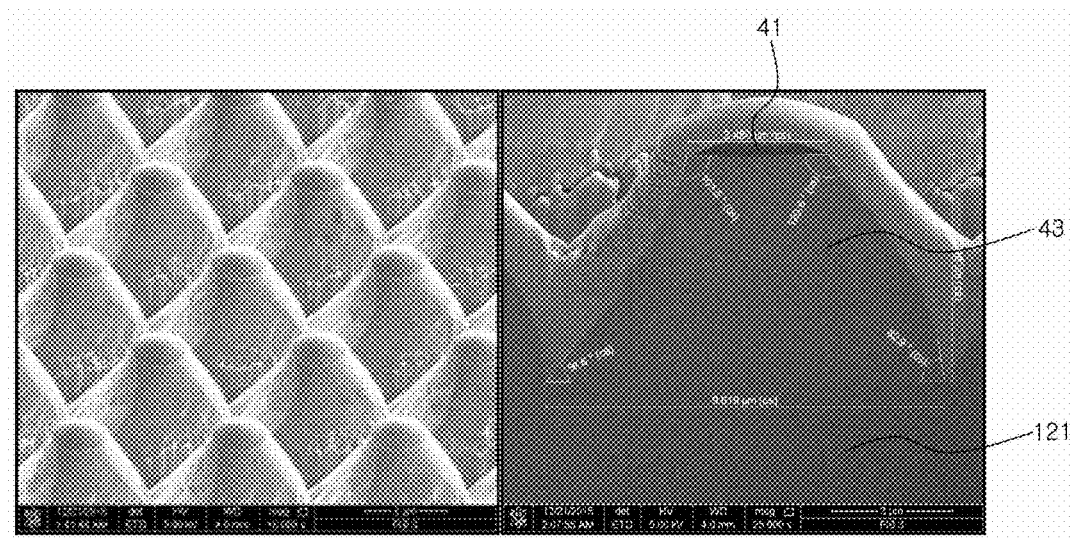
FIG. 14B shows scanning electron microscope (SEM) images illustrating a surface texture formed on a lower surface of a gallium nitride substrate of a light emitting diode according to another exemplary embodiment of the present disclosure.

FIG. 14A and FIG. 14B show scanning electron microscope (SEM) images of surface textures R. FIG. 14A shows SEM images of surface textures R formed on a lower surface of a gallium nitride substrate 21 having the c-plane as the growth plane and FIG. 14B shows SEM images of surface textures R formed on a lower surface of a gallium nitride substrate 121 having the m-plane as the growth plane. In FIGS. 14A and 14B, the right side images show enlarged cross-sections of the surface textures.

The surface textures R may be formed by forming a mask pattern on the lower surface of the substrate 21, followed by etching the gallium nitride substrate 21 using the mask pattern as an etching mask. Each of the masks 41 of the mask pattern may be formed of $SiO_2$. As shown in FIG. 14A and FIG. 14B, truncated cones 43 are formed and the mask 41 may remain on each of the truncated cones 43. The truncated cones 43 may be arranged in a honeycomb structure. Further, the masks 41 may have a slightly convex shape.

The gallium nitride substrates 21, 121 may have a high index of refraction of about 2.43. Accordingly, total internal reflection is likely to occur on the lower surface of each of the substrates 21, 121. However, the truncated cones 43 can reduce occurrence of total internal reflection. Furthermore, the mask formed of $SiO_2$ having a low index of refraction remains on each of the truncated cones 43, thereby further reducing occurrence of total internal reflection on a flat surface of the truncated cone 43.

Furthermore, as can be seen from the enlarged images, a valley formed between the truncated cones 43 has a sharp shape instead of a flat bottom. Accordingly, it is possible to prevent total internal reflection on the bottom of the valley between the truncated cones 43.

In this exemplary embodiment, the mesa M includes the fingers F and the palm P, and the inner contact portions 35a1 may extend from the outer contact portion 35a2. However, it should be understood that the present disclosure is not limited thereto. Alternatively, the mesa M may include through-holes instead of the fingers and the inner contact portions 35a1 may be separated from the outer contact portion 35a2. In this exemplary embodiment, the mesa M may have a quadrangular shape substantially similar to the shape of the substrate 21 and may include the through-holes formed in an inner region surrounded by the edge of the mesa M.

According to this exemplary embodiment, the first contact layer 35a includes the inner contact portions 35a1 and the outer contact portion 35a2, in which the outer contact portion 35a2 is disposed near the edge of the first conductivity-type semiconductor layer 23 along the circumference of the mesa M. That is, the outer contact portion 35a2 surrounds the mesa M along the edge of the first conductivity-type semiconductor layer 23. In addition, the inner contact portions 35a1 are connected to the first conductivity-type semiconductor layer 23 inside a region surrounded by the outer contact portion 35a2. With this structure, the first contact layer 35a can be connected to various points of the first conductivity-type semiconductor layer 23, thereby preventing current crowding in a specific region. Furthermore, the first contact layer 35a extends above the mesa M, thereby achieving more uniform current spreading.

Furthermore, with the gallium nitride substrate 21 having a thickness of about 300 μm or more, the light emitting diode can more easily dissipate heat generated from the active layer 25, thereby improving thermal characteristics thereof.

Figure 15:
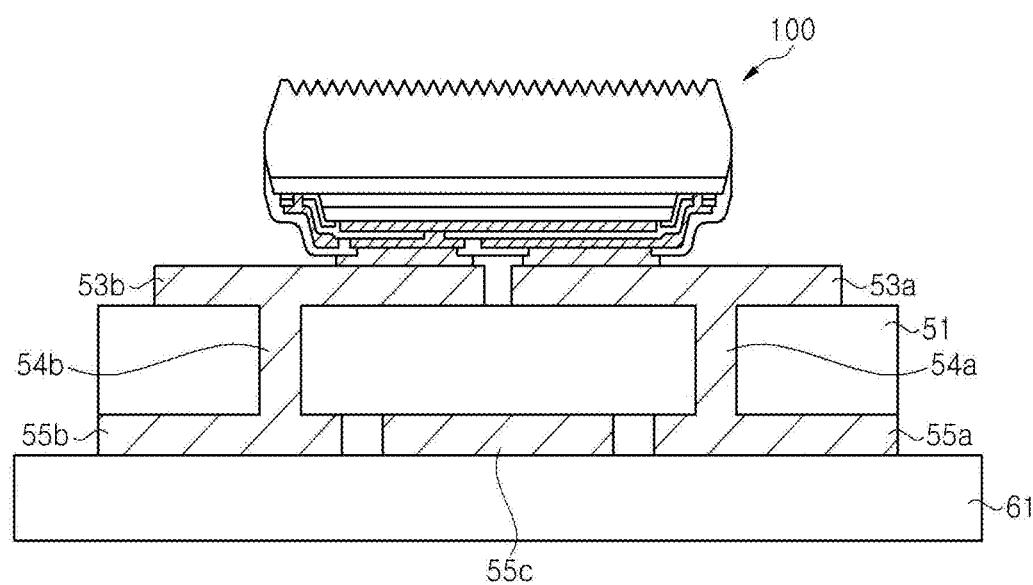
FIG. 15 is a sectional view of a light emitting module according to one exemplary embodiment of the present disclosure.
Figure 16A:
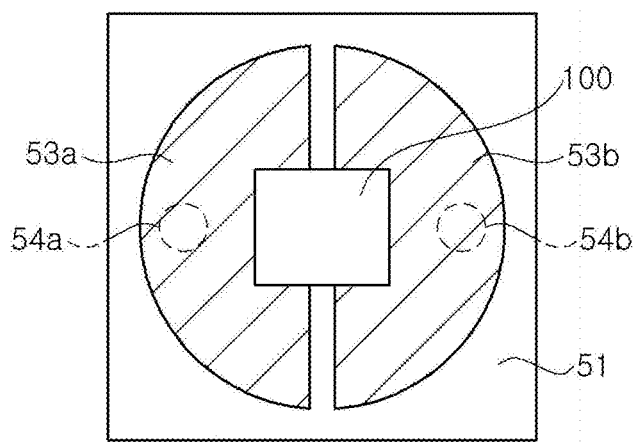
FIGS. 16A and 16B show a plan view and a bottom view of a submount substrate of the light emitting module according to the exemplary embodiment of the present disclosure.
Figure 16B:
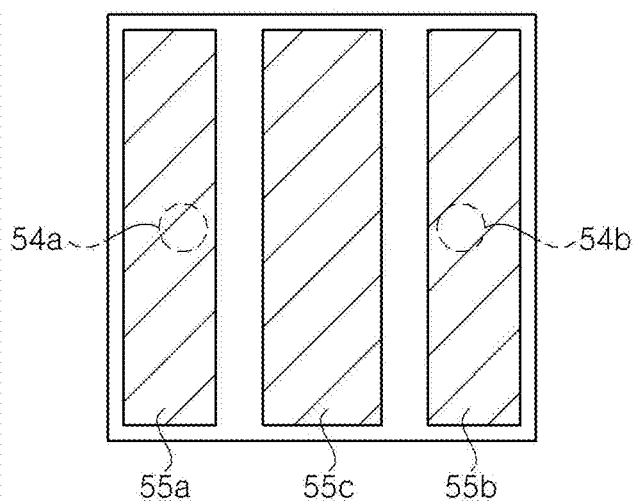

FIG. 15 is a schematic sectional view of a light emitting module according to one exemplary embodiment of the present disclosure. FIGS. 16A and 16B show a plan view and a bottom view of a submount substrate of the light emitting module according to the exemplary embodiment of the present disclosure.

Referring to FIG. 15, the light emitting module includes a printed circuit board (PCB) 61, a submount 51, and a light emitting diode 100. The submount 51 may be omitted.

The printed circuit board 61 may be a metal PCB such as an Al-PCB or a Cu-PCB. Since Cu has higher thermal conductivity than Al, Cu can more rapidly dissipate heat from the light emitting diode 100.

Referring to FIGS. 15, 16A, and 16B, the submount 51 includes an upper electrode pattern and a lower electrode pattern formed on the base substrate. In addition, the upper electrode pattern may include a first upper electrode 53*a* and a second upper electrode 53*b*, and the lower electrode pattern may include a first lower electrode 55*a* and a second lower electrode 55*b*. The lower electrode pattern may further include a heat dissipation pad 55*c*.

The base substrate of the submount 51 may be an AlN substrate. Further, each of the upper electrode pattern and the lower electrode pattern may have a multilayer structure of Ni/Cu/Au layers. The Ni layer serves to improve bonding strength of the electrode patterns to the AlN substrate and the Au layer serves to prevent oxidation of the Cu layer while improving bonding strength with respect to electrode pads 39*a*, 39*b* of the light emitting diode 100. In addition, the Cu layer serves to allow transfer of electric current and heat and is has a greater thickness than the Ni layer and the Au layer.

Vias 54*a*, 54*b* are formed through the AlN substrate of submount 51 such that the first and second upper electrodes 53*a*, 53*b* are connected to the first and second lower electrodes 55*a*, 55*b* therethrough.

The heat dissipation pad 55*c* is interposed between the first and second lower electrodes 55*a*, 55*b* and is electrically insulated from the first and second lower electrodes 55*a*, 55*b*. The heat dissipation pad 55*c* may be disposed to assist in heat dissipation through contact with the printed circuit board 61, particularly a metal of a metal PCB 61.

The light emitting diode 100 is the same as the light emitting diode described with reference to FIGS. 1A and 1B and a detailed description thereof will be omitted. The light emitting diode 100 may be mounted on the submount 51 after being inverted in a flip-chip shape. The electrode pads 39*a*, 39*b* (see FIGS. 1A and 1B) of the light emitting diode 100 are bonded to the first and second upper electrodes 53*a*, 53*b* of the submount 51.

With the submount 51 and the metal PCB 61, the light emitting module can easily dissipate heat generated from the light emitting diode 100, thereby further increasing current density for operation of the light emitting diode 100.

Although the light emitting module according to this exemplary embodiment includes the light emitting diode 100 as shown in FIGS. 1A and 1B, a light emitting diode according to another exemplary embodiment may also be mounted on the submount 51. Hereinafter, the light emitting diode according to the other exemplary embodiment will be described.

FIGS. 17A, 17B, 18A, 18B, 19A, 19B, 20A, 20B, 21A and 21B are plan views and cross-sectional views illustrating a method of manufacturing a light emitting diode according to another exemplary embodiment of the present disclosure.

Figure 17A:
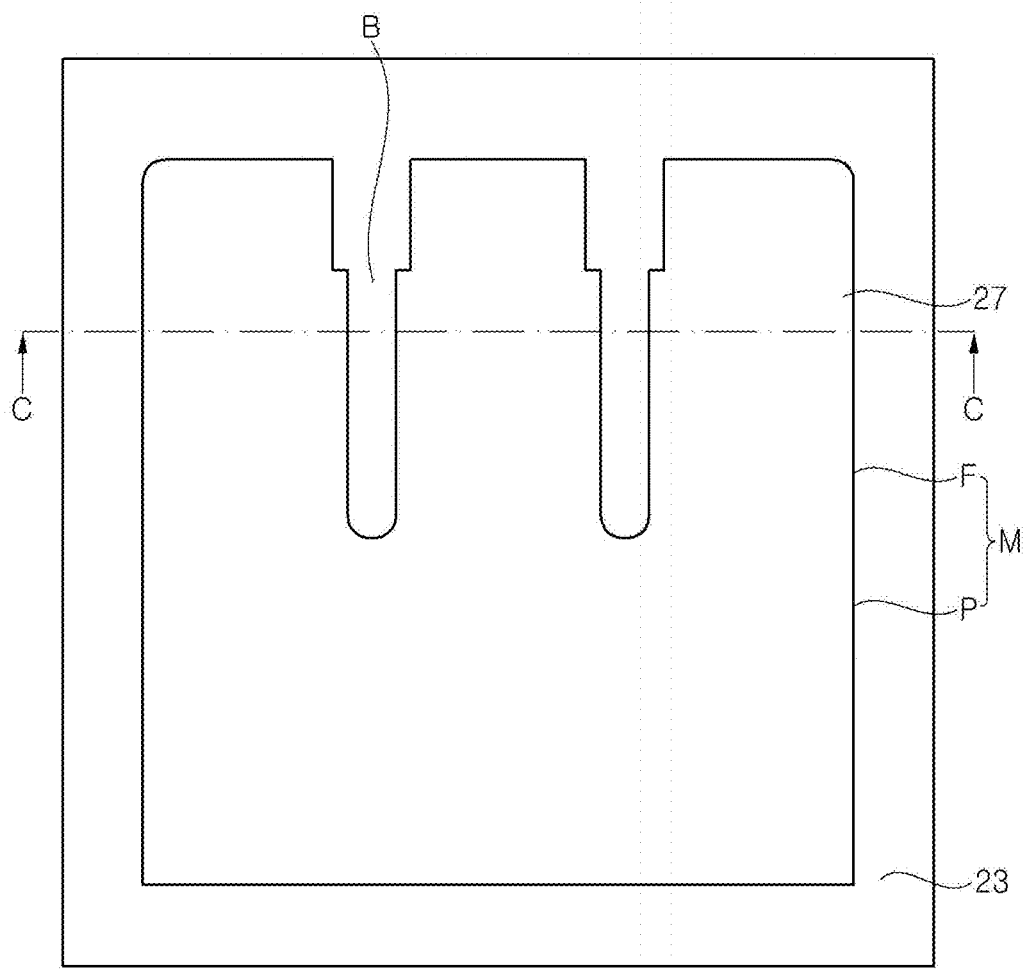
FIGS. 17A, 17B, 18A, 18B, 19A, 19B, 20A, 20B, 21A, and 21B are plan views and cross-sectional views illustrating a method of manufacturing a light emitting diode according to another exemplary embodiment of the present disclosure.
Figure 17B:
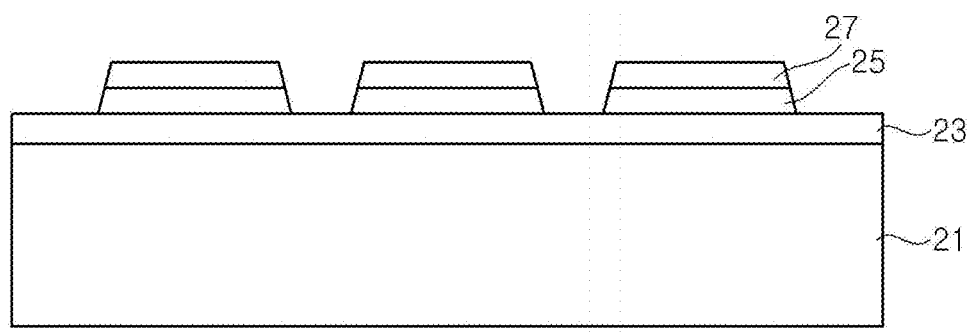

Referring to FIGS. 17A and 17B, a first conductivity-type semiconductor layer 23, an active layer 25 and a second conductivity-type semiconductor layer 27 are grown on a gallium nitride substrate 21, and a mesa M is formed using these semiconductor layers, as described with reference to FIGS. 2A and 2B. The mesa M includes fingers F and a palm P, and an indentation B is formed between the fingers F. In this exemplary embodiment, an inlet of the indentation B has a relatively large width.

Figure 18A:
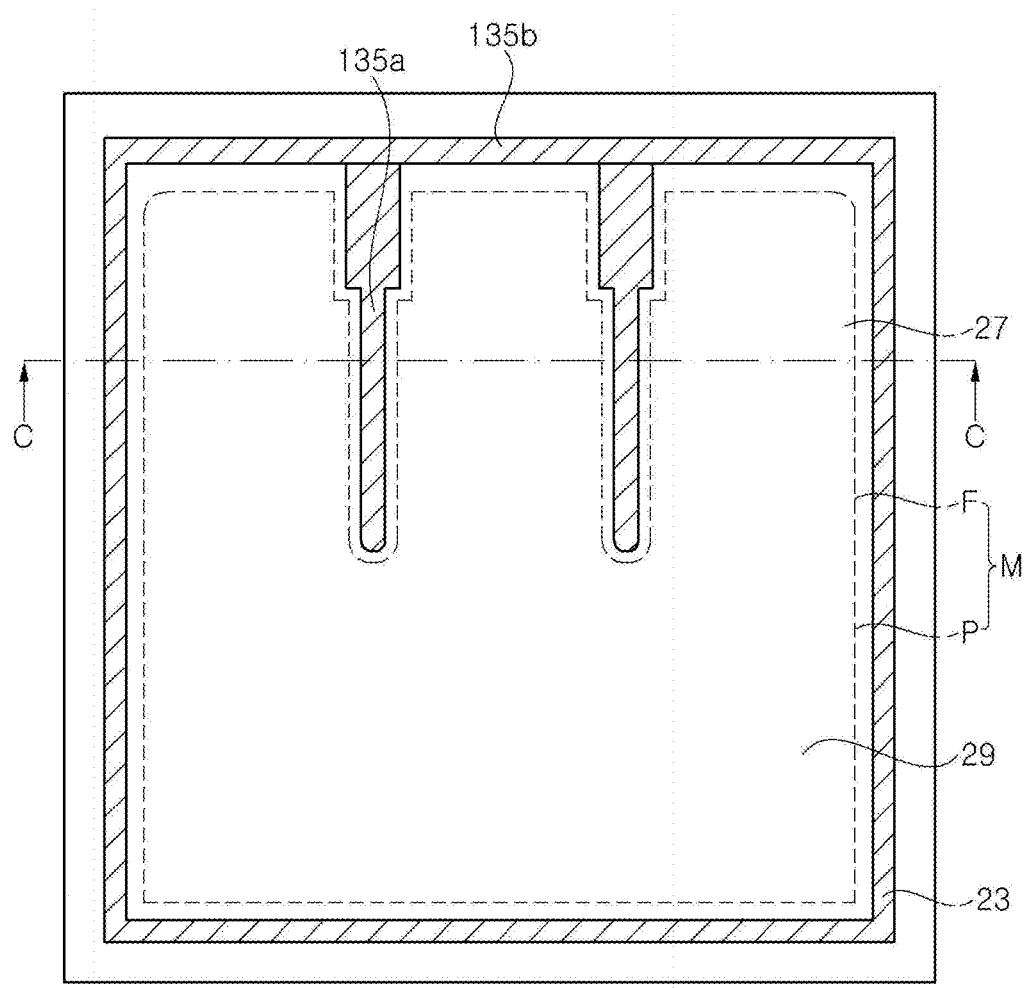
Figure 18B:
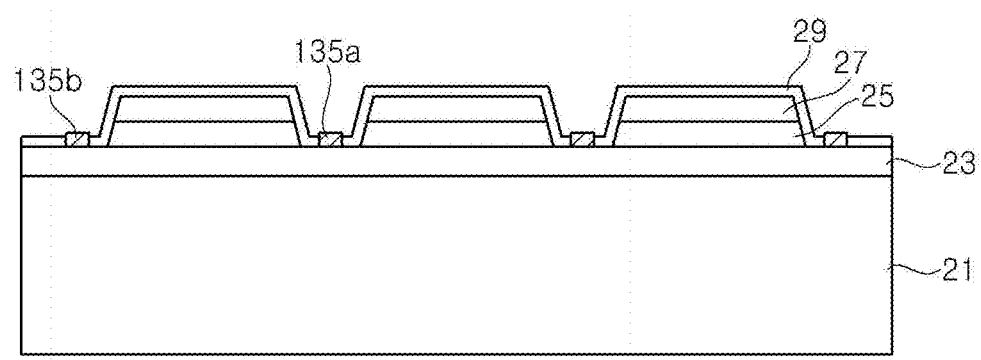

Referring to FIGS. 18A and 18B, a pre-insulation layer 29 is formed to cover the first conductivity-type semiconductor layer 23 and the mesa M. As described with reference to FIGS. 3A and 3B, the pre-insulation layer 29 may be formed of $SiO_2$ by, for example, chemical vapor deposition.

In addition, a photoresist pattern (not shown) is formed on the pre-insulation layer 29 and the pre-insulation layer 29 is subjected to etching through the photoresist pattern used as an etching mask to expose the first conductivity-type semiconductor layer 23 near an edge of the substrate 21 along a region between the fingers F and the circumference of the mesa M. The pre-insulation layer 29 may be subjected to etching, for example, wet etching.

Then, a first contact layer is formed on the exposed first conductivity-type semiconductor layer 23. The first contact layer includes an inner contact portion 135*a* which contacts the first conductivity-type semiconductor layer 23 in the region between the fingers F, and an outer contact portion 135*b* which contacts the first conductivity-type semiconductor layer 23 exposed around the mesa. The first contact layer may be formed by a lift-off technique using the photoresist pattern.

As described with reference to FIGS. 7A and 7B, the first contact layer 35*a* may include a highly reflective metal layer, such as an Al layer, which may be formed on a bonding layer such as a Ti, Cr or Ni layer. In addition, a protective layer composed of a single layer or combined layer of Ni, Cr, and Au may be formed on the highly reflective metal layer.

Figure 19A:
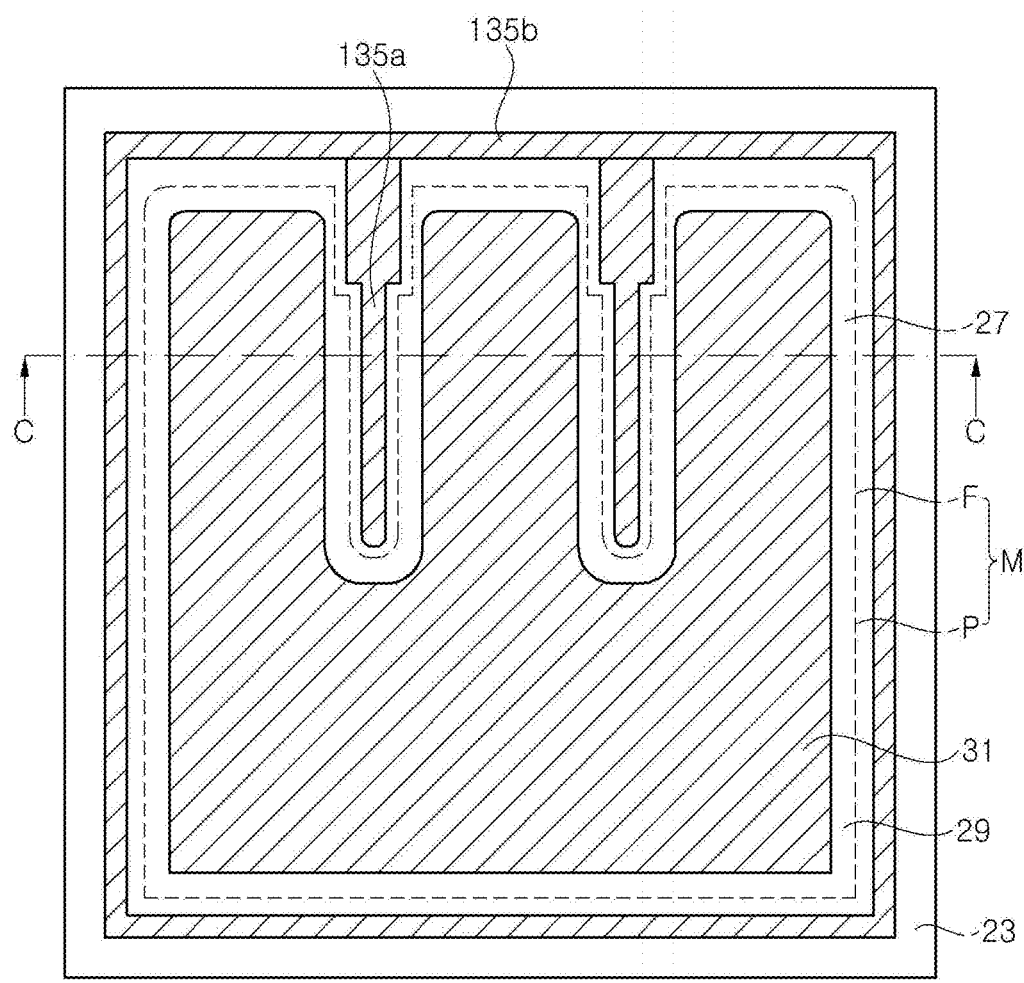
Figure 19B:
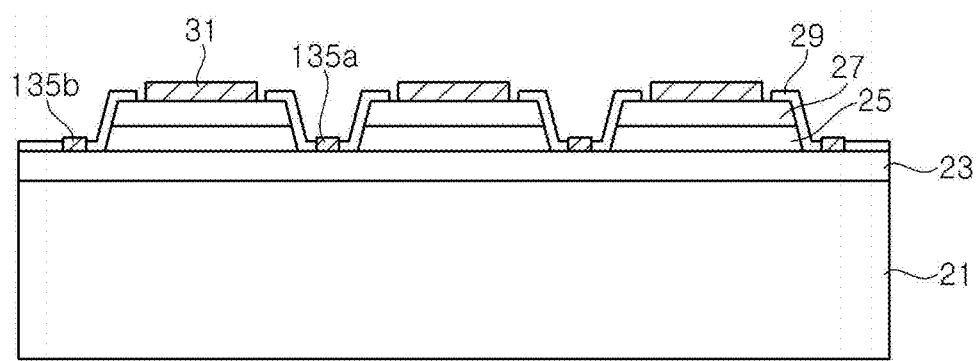

Referring to FIGS. 19A and 19B, a photoresist pattern is formed again on the pre-insulation layer 29, as described with reference to FIGS. 3A and 3B. This photoresist pattern has an opening exposing an upper region of the mesa M. Although the opening has substantially similar shape to the shape of the mesa M, the opening may have a slightly smaller size than the mesa M. That is, a photoresist may cover edges of the mesa M. In addition, the opening may be formed such that the bottom of the opening has a greater width than an inlet thereof. For example, the photoresist pattern 30 having such an opening can be easily formed using a negative type photoresist.

Then, the pre-insulation layer 29 is subjected to etching using the photoresist pattern 30 as an etching mask to expose the second conductivity-type semiconductor layer 27. The pre-insulation layer 29 may be subjected to etching, for example, wet etching.

Thereafter, a second contact layer 31 is formed and the photoresist pattern is removed. The second contact layer 31 is the same as the second contact layer described with reference to FIGS. 3A, 3B, 4A and 4B, and thus a detailed description thereof will be omitted to avoid repetition.

Figure 20A:
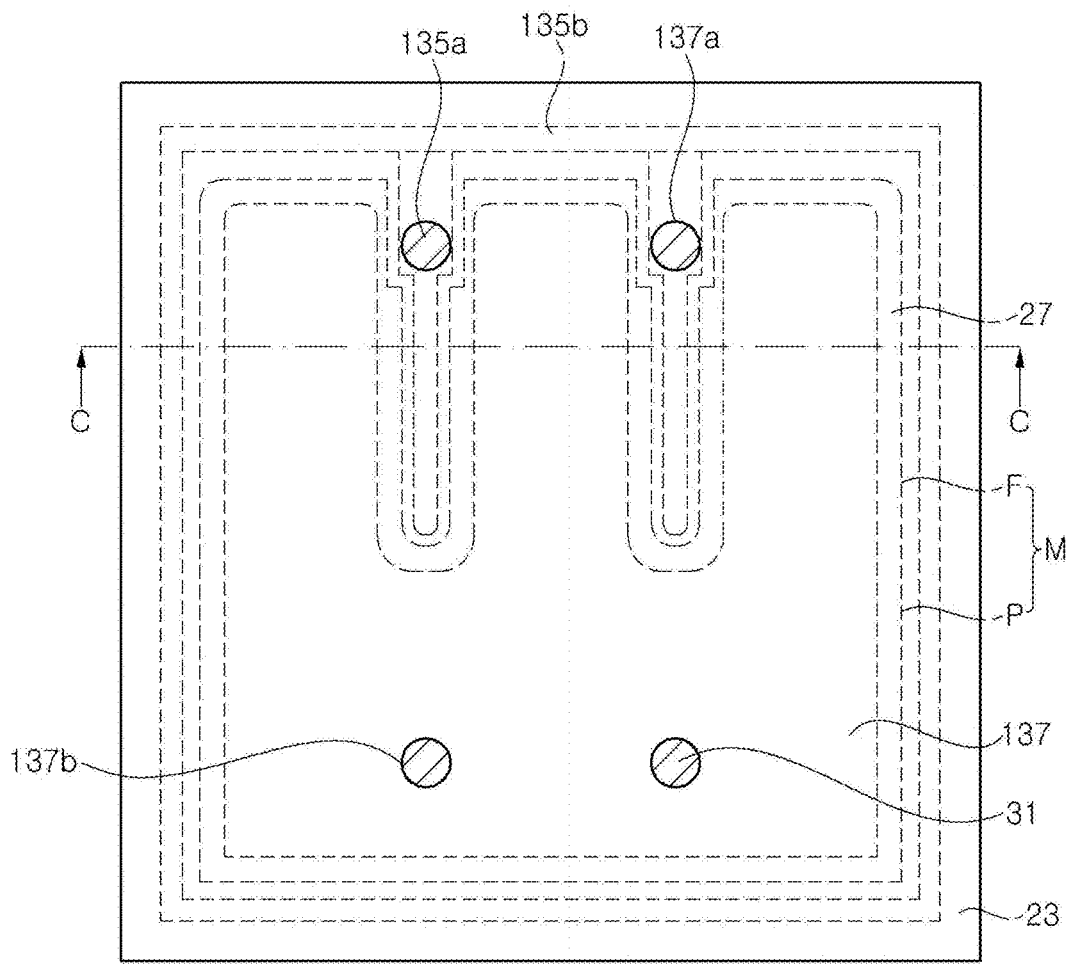
Figure 20B:
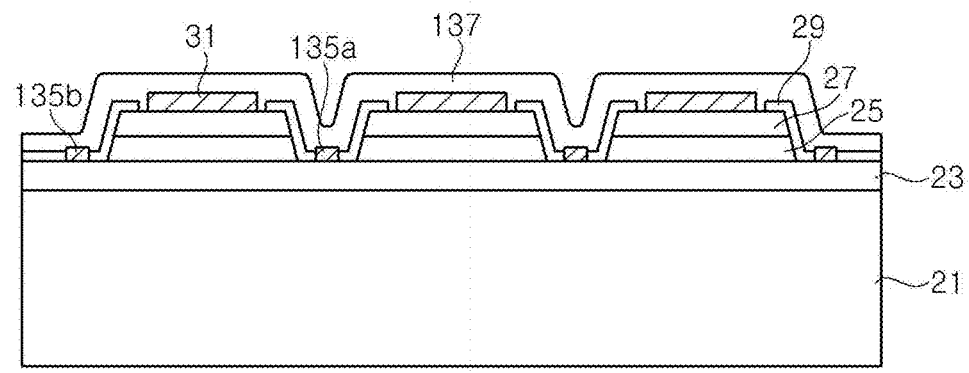

Referring to FIGS. 20A and 20B, an upper insulation layer 137 is formed to cover the first contact layer and the second contact layer 31. The upper insulation layer 137 may also cover the edge of the first conductivity-type semiconductor layer 23. The upper insulation layer 137 has an opening 137*a* which exposes the inner contact portion 135*a*, and an opening 137*b* which exposes the second contact layer 31. The opening 137*a* is formed to to overlap the inner contact portion 135*a* of the first contact layer and the opening 137*b* is formed to overlap the second contact layer 31 on the palm P of the mesa M.

The upper insulation layer 137 may be composed of a single layer of silicon nitride or silicon oxide, without being limited thereto. Alternatively, the upper insulation layer 137 may include a multilayer structure or a distributed Bragg reflector. Although not shown herein, an inclined surface L1 is formed on the upper surface of the substrate 21 and the upper insulation layer 37 may cover the inclined surface L1 to cover the side surface of the first conductivity-type semiconductor layer 23.

Figure 21A:
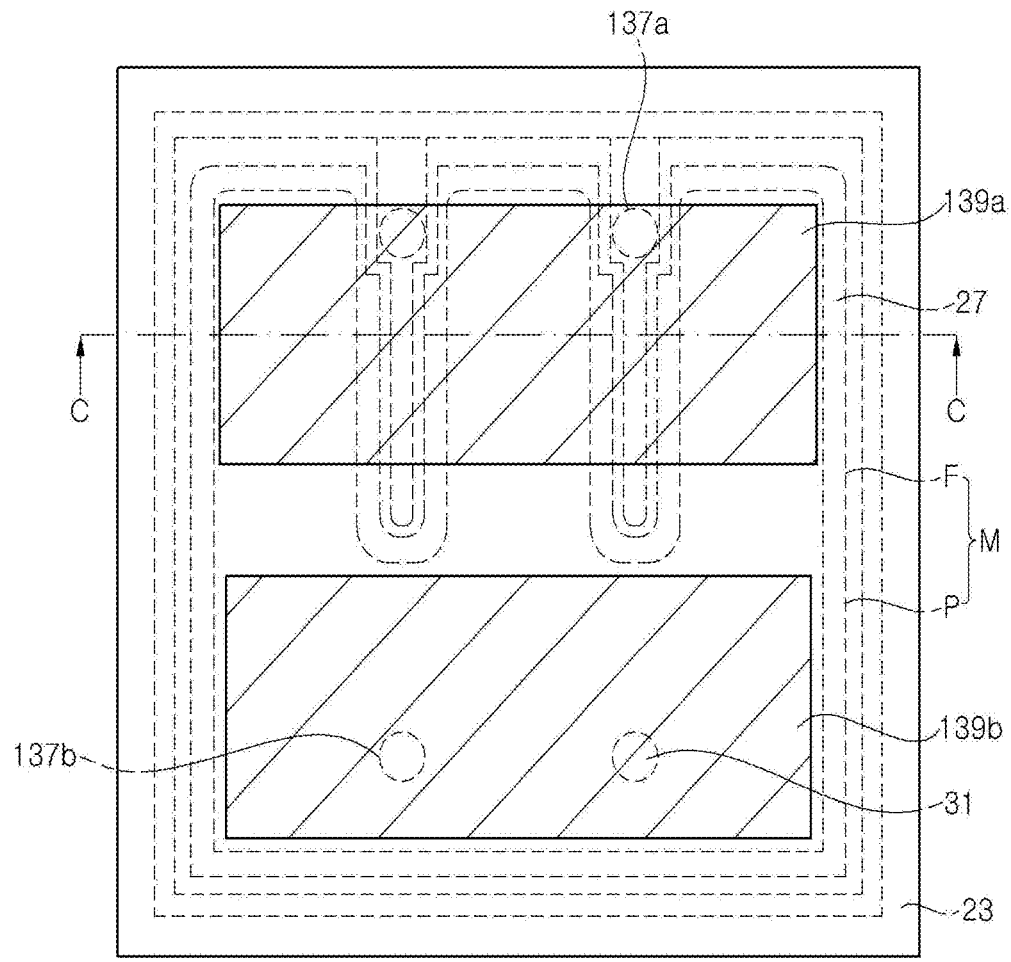
Figure 21B:
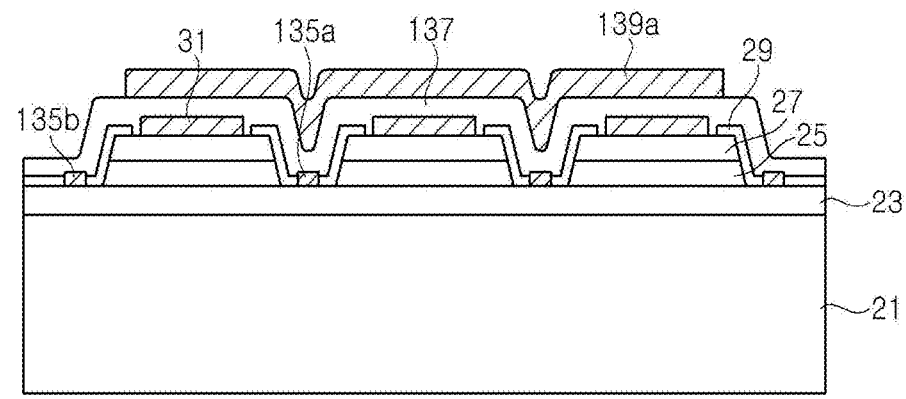

Referring to FIGS. 21A and 21B, a first electrode pad 139*a* and a second electrode pad 139*b* are formed on the upper insulation layer 137, as described with reference to FIGS. 10A and 10B. The first electrode pad 139*a* is connected to the inner contact portion 135a of the first contact layer through the opening 137a of the upper insulation layer 137, and the second electrode pad 139b is connected to the second contact layer 31 through the opening 137b of the upper insulation layer 137. The first electrode pad 139a and the second electrode pad 139b are used to mount the light emitting diode on a submount or a printed circuit board. The first electrode pad 39a and the second electrode pad 39b may be formed of AuSn and mounted on the submount or the like through eutectic bonding.

A distance D between the first and second electrode pads may be set to about 80 μm or more in order to prevent short circuit.

The first and second electrode pads 39a, 39b may be formed together by the same process, for example, a lift-off technique.

The light emitting diode according to this exemplary embodiment can be manufactured by a relatively simple process. Although the shape of the side surface of the substrate 21 formed through laser scribing is not illustrated in this exemplary embodiment, laser scribing may also be performed in a similar way to the above exemplary embodiment and thus inclined surfaces L1, L2 may also be formed on the upper and lower surfaces of the substrate 21 as in the above exemplary embodiment.

Figure 22A:
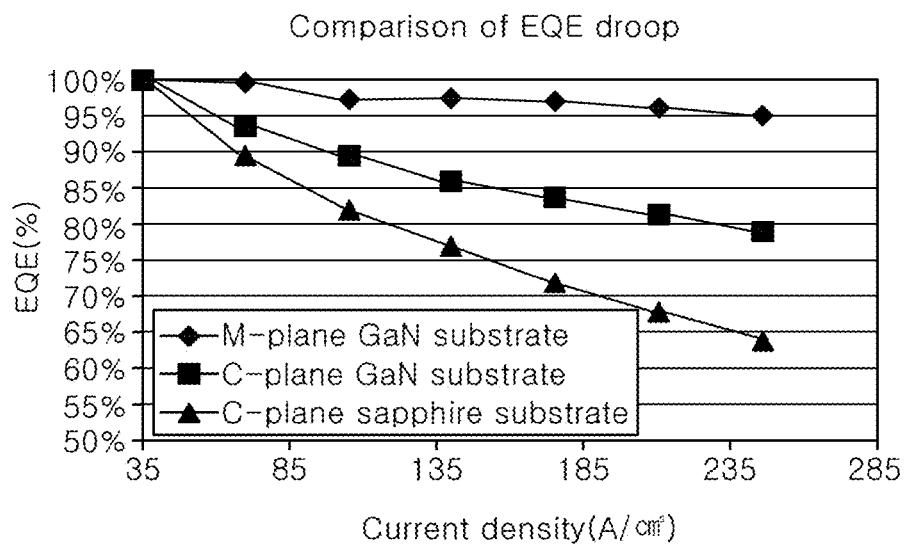
FIG. 22A is a graph depicting a relationship between external quantum efficiency and current density depending upon the kind of growth substrate.
Figure 22B:
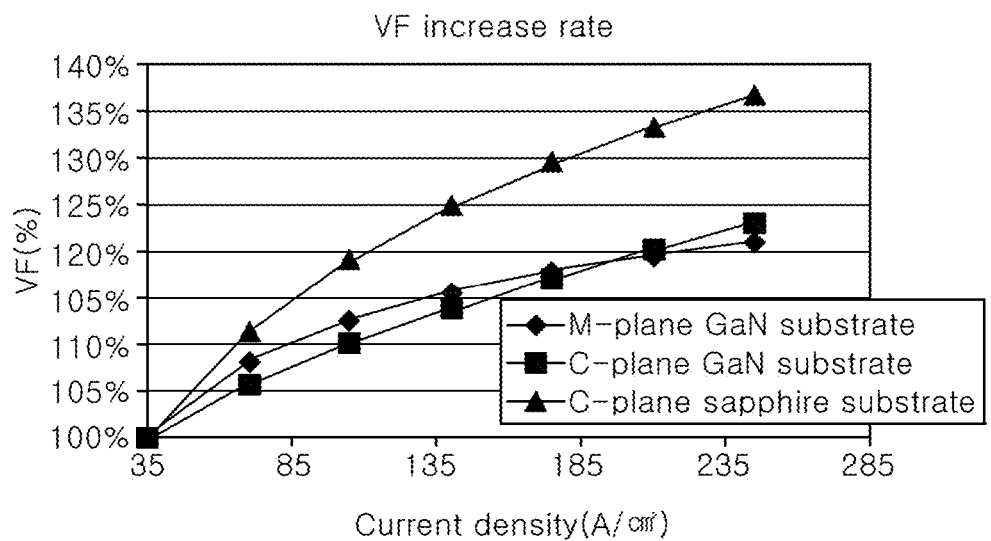
FIG. 22B is a graph depicting a relationship between forward voltage and current density depending upon the kind of growth substrate.

FIG. 22A is a graph depicting a relationship between external quantum efficiency and current density depending upon the kind of growth substrate. FIG. 22B is a graph depicting a relationship between forward voltage and current density depending upon the kind of growth substrate. Light emitting diodes were manufactured by the same process except for the growth substrates.

Referring to FIG. 22A, it could be seen that a light emitting diode manufactured using a c-plane sapphire substrate as a growth substrate exhibited more significant drooping of external quantum efficiency with increasing current density. The external quantum efficiency of the light emitting diode at a current density of about 150 A/cm$^2$ was reduced to less than 75%, as compared with the external quantum efficiency thereof at a current density of 35 A/cm$^2$. In general, considering that a light emitting diode manufactured using a sapphire substrate as the growth substrate has a maximum quantum efficiency of about 10 A/cm$^2$, the light emitting diode manufactured using the sapphire substrate as the growth substrate will suffer from severer drooping of the external quantum efficiency.

On the contrary, light emitting diodes manufactured using a c-plane gallium nitride substrate and an m-plane gallium nitride substrate exhibited less drooping. In particular, the light emitting diode manufactured using the m-plane gallium nitride substrate exhibited an external quantum efficiency of 90% or more at a current density of 235 A/cm$^2$ or more.

In addition, referring to FIG. 22B, it could be seen that the light emitting diode manufactured using the sapphire substrate exhibited a more rapid increase in forward voltage VF with increasing current density than the light emitting diode manufactured using the gallium nitride substrate. On the other hand, the light emitting diode manufactured using the c-plane gallium nitride substrate or the m-plane gallium nitride substrate exhibited a gentle increase in forward voltage VF with increasing current density and thus had substantially no difference.

Accordingly, it could be seen that the light emitting diode manufactured using the gallium nitride substrate 21 can operate at a higher current density than the light emitting diode manufactured using the sapphire substrate.

Figure 23:
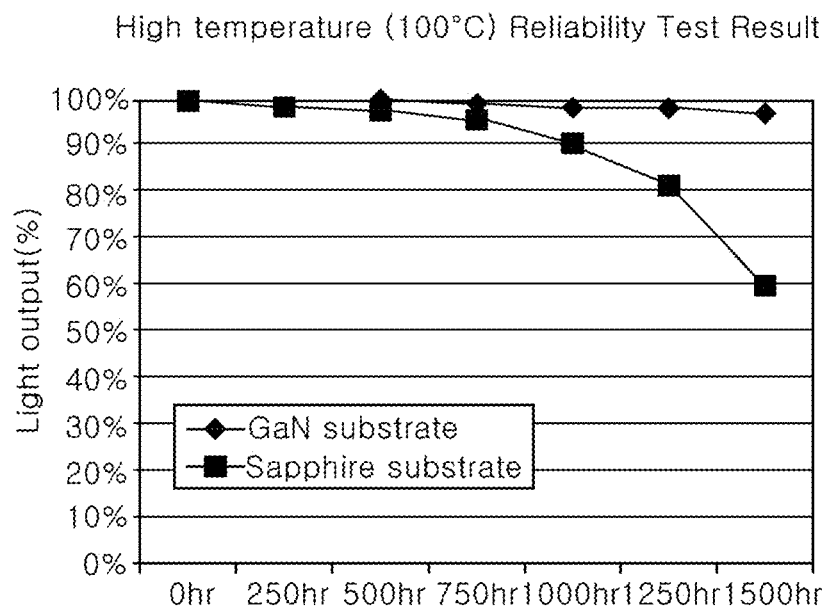
FIG. 23 is a graph depicting a reliability test result depending upon the kind of growth substrate.

FIG. 23 is a graph depicting reliability test results depending upon the kind of growth substrate. Light output was measured over time while operating the light emitting diode at a current density of 245 A/cm$^2$ for a long period of time, with the inner temperature of a chamber maintained at 100° C.

Referring to FIG. 23, the light emitting diode manufactured using the sapphire substrate as the growth substrate exhibited reduction in light output after operation for 250 hours, reduction in light output by 10% when operated for 1,000 hours, and reduction in light output by 40% or more when operated for 1,500 hours.

On the contrary, the light emitting diode manufactured using the gallium nitride substrate as the growth substrate maintained 95% or more of initial light output even after 1,500 hours.

Figure 24:
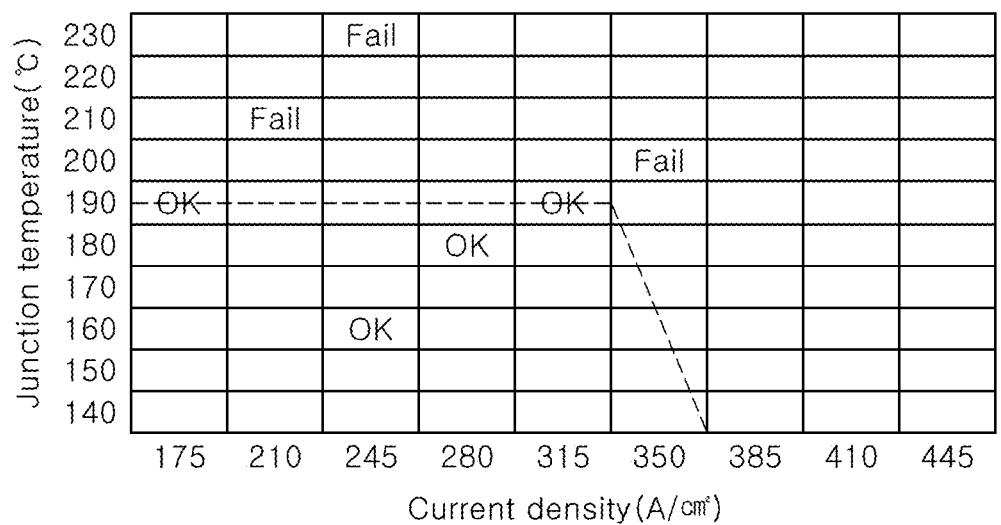
FIG. 24 is a graph depicting reliability test results with respect to junction temperature of light emitting diodes according to exemplary embodiments of the present disclosure.

FIG. 24 is a graph depicting reliability test results with respect to junction temperature of light emitting diodes according to exemplary embodiments of the present disclosure. Failure of the light emitting diodes was measured while operating the light emitting diode at a constant current density for 1,000 hours or more, with the inner temperature of the chamber maintained at 100° C.

Referring to FIG. 24, the light emitting diodes according to the exemplary embodiments exhibited good operation at a current density of 315 A/cm$^2$ and at a junction temperature of 190° C. Accordingly, it could be seen that the light emitting diodes according to the exemplary embodiments had a maximum junction temperature of 190° C. or more.

Exemplary embodiments of the present disclosure provide a high-power light emitting diode, which emits light in an increased quantity per unit area without a separate cooling system, and a light emitting module including the same. In addition, the light emitting diode employs a gallium nitride substrate, the first contact layer includes an outer contact portion and an inner contact portion, and the second contact layer is disposed on the mesa, thereby improving luminous efficacy through improvement in current spreading efficiency in the horizontal direction.

Although some exemplary embodiments have been described herein, it should be understood that these embodiments are provided for illustration only and are not to be construed in any way as limiting the present invention. In addition, a component described in a specific exemplary embodiment may also be applied to other exemplary embodiments without departing from the scope of the present invention.

What is claimed is:
1. A light emitting diode, comprising:
a gallium nitride substrate;
a first conductivity-type semiconductor layer disposed on the gallium nitride substrate;
a mesa comprising a second conductivity-type semiconductor layer disposed on the first conductivity-type semiconductor layer and an active layer interposed between the second conductivity-type semiconductor layer and the first conductivity-type semiconductor layer;
a first contact layer comprising an outer contact portion disposed along a circumference of the mesa and contacting the first conductivity-type semiconductor layer near an edge of the gallium nitride substrate and a plurality of inner contact portions disposed in a region surrounded by the outer contact portion and contacting the first conductivity-type semiconductor layer;
a second contact layer disposed on the mesa and contacting the second conductivity-type semiconductor layer;

an upper insulation layer having a first opening overlapping the first contact layer and a second opening overlapping the second contact layer;

a first electrode pad electrically connected to the first contact layer through the first opening; and a second electrode pad electrically connected to the second contact layer through the second opening, wherein the light emitting diode is configured to operate at a current density of between 150 A/cm$^2$ and 315 A/cm2 with a maximum junction temperature of between 150° C. and 190 °.

2. The light emitting diode of claim 1, wherein the inner contact portions extend from the outer contact portion.

3. The light emitting diode of claim 1, wherein the first contact layer is spaced apart from the mesa while covering an upper region of the mesa and has an opening overlapping the second contact layer, and a sidewall of the opening of the first contact layer is covered by the upper insulation layer.

4. The light emitting diode of claim 3, further comprising:
an intermediate connecting portion disposed inside the opening of the first contact layer and connected to the second contact layer, wherein the second opening of the upper insulation layer exposes the intermediate connecting portion and the second electrode pad is connected to the intermediate connecting portion.

5. The light emitting diode of claim 4, further comprising:
a lower insulation layer covering the first conductivity-type semiconductor layer and the mesa to insulate the first contact layer from the mesa, the lower insulation layer being interposed between the second contact layer and the intermediate connecting portion, wherein the lower insulation layer has an opening exposing the first conductivity-type semiconductor layer such that the outer contact portion and the inner contact portion contact the first conductivity-type layer through the opening exposing the first conductivity-type semiconductor layer, wherein the lower insulation layer has an opening exposing the second contact layer, and wherein the intermediate connecting portion is connected to the second contact layer through the opening of the lower insulation layer exposing the second contact layer.

6. The light emitting diode of claim 1, wherein the gallium nitride substrate comprises a side surface and has a thickness of 300 μm or more, wherein the side surface of the gallium nitride substrate comprising a perpendicular surface perpendicular to an upper surface of the gallium nitride substrate on which the first conductivity-type semiconductor layer is placed and a first inclined surface connecting the perpendicular surface to a lower surface of the gallium nitride substrate, and wherein the perpendicular surface having a height of 50 μm to 200 μm.

7. The light emitting diode of claim 6, wherein the side surface of the gallium nitride substrate further comprises a second inclined surface connecting the perpendicular surface to the upper surface of the gallium nitride substrate, and wherein the gallium nitride substrate has a depth of 30 μm to 50 μm from the upper surface of the gallium nitride substrate to the perpendicular surface and a depth of 80 μm to 100 μm from the lower surface of the gallium nitride substrate to the perpendicular surface.

8. The light emitting diode of claim 7, wherein the upper insulation layer covers the second inclined surface above the perpendicular surface along an edge of the gallium nitride substrate.

9. The light emitting diode of claim 1, wherein the gallium nitride substrate comprises a surface texture formed on a lower surface of the gallium nitride substrate, and wherein the surface texture comprises a plurality of truncated cones.

10. The light emitting diode of claim 9, further comprising an SiO$_2$ mask disposed on each of the truncated cones.

11. The light emitting diode of claim 10, wherein a sharp valley is formed between the truncated cones.

12. The light emitting diode of claim 1, wherein the gallium nitride substrate has a dopant concentration of 8E17/cm$^3$ to 1E18/cm$^3$ and the first conductivity-type semiconductor layer has a dopant concentration of 1E19/cm$^3$ to 2E19/cm$^3$.

13. A light emitting module, comprising:
a printed circuit board;
a submount mounted on the printed circuit board; and
a light emitting diode comprising:
a gallium nitride substrate;
a first conductivity-type semiconductor layer disposed on the gallium nitride substrate;
a mesa comprising a second conductivity-type semiconductor layer disposed on the first conductivity-type semiconductor layer and an active layer interposed between the second conductivity-type semiconductor layer and the first conductivity-type semiconductor layer;
a first contact layer comprising an outer contact portion disposed along a circumference of the mesa and contacting the first conductivity-type semiconductor layer near an edge of the gallium nitride substrate and a plurality of inner contact portions disposed in a region surrounded by the outer contact portion and contacting the first conductivity-type semiconductor layer;
a second contact layer disposed on the mesa and contacting the second conductivity-type semiconductor layer;
an upper insulation layer having a first opening overlapping the first contact layer and a second opening overlapping the second contact layer;
a first electrode pad electrically connected to the first contact layer through the first opening; and
a second electrode pad electrically connected to the second contact layer through the second opening,
wherein the light emitting diode is configured to operate at a current density of between 150 A/cm$^2$ and 315 A/cm2 with a maximum junction temperature of between 150° C. and 190°, and
wherein the light emitting diode is flip-bonded to the submount.

14. The light emitting module of claim 13, wherein the submount comprises:
a base substrate;
an upper electrode pattern disposed on the base substrate and comprising a first upper electrode and a second upper electrode;
a lower electrode pattern disposed on a bottom of the base substrate and comprising a first lower electrode and a second lower electrode; and
vias connecting the upper electrode pattern to the lower electrode pattern.

15. The light emitting module of claim 14, wherein the base substrate is an aluminum nitride substrate.

16. The light emitting module of claim 14, wherein the lower electrode pattern further comprises a heat dissipation pad.

17. The light emitting module of claim 13, wherein the inner contact portions extend from the outer contact portion.

18. The light emitting module of claim 13, wherein the first contact layer is spaced apart from the mesa while covering an upper region of the mesa and has an opening overlapping the second contact layer, and wherein a sidewall of the opening of the first contact layer is covered by the upper insulation layer.

19. The light emitting module of claim 18, wherein the light emitting diode further comprises:

an intermediate connecting portion disposed inside the opening of the first contact layer and connected to the second contact layer, wherein the second opening of the upper insulation layer exposes the intermediate connecting portion and the second electrode pad is connected to the intermediate connecting portion.

20. The light emitting module of claim 19, wherein the light emitting diode further comprises:

a lower insulation layer covering the first conductivity-type semiconductor layer and the mesa to insulate the first contact layer from the mesa, the lower insulation layer being interposed between the second contact layer and the intermediate connecting portion, wherein the lower insulation layer has an opening exposing the first conductivity-type semiconductor layer such that the outer contact portion and the inner contact portion contact the first conductivity-type semiconductor layer through the opening exposing the first conductivity-type semiconductor layer, wherein the lower insulation layer has an opening exposing the second contact layer, and wherein the intermediate connecting portion is connected to the second contact layer through the opening of the lower insulation layer.

* * * * *